(12) United States Patent
Sato

(10) Patent No.: US 6,454,515 B2
(45) Date of Patent: Sep. 24, 2002

(54) SEMICONDUCTOR WAFER ACCOMMODATING JIG, HANDLING METHOD AND PRODUCTION SYSTEM

(75) Inventor: Akira Sato, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/827,931

(22) Filed: Apr. 9, 2001

Related U.S. Application Data

(62) Division of application No. 09/229,446, filed on Jan. 13, 1999, now Pat. No. 6,247,597.

(30) Foreign Application Priority Data

Jan. 13, 1998 (JP) .......................................... 10-004610

(51) Int. Cl.[7] .............................................. B65G 1/133
(52) U.S. Cl. ................. 414/751.1; 294/68.3; 294/119.1
(58) Field of Search ............................ 414/749.1, 940, 414/751.1; 29/426.1; 118/500; 294/119.1, 68.3

(56) References Cited

U.S. PATENT DOCUMENTS

| | | |
|---|---|---|
| 5,314,068 A | 5/1994 | Nakazato et al. |
| 5,628,604 A | 5/1997 | Murata et al. |
| 5,713,711 A | 2/1998 | McKenna et al. |
| 5,788,458 A | 8/1998 | Bonora et al. |

FOREIGN PATENT DOCUMENTS

| | | |
|---|---|---|
| JP | 6-196545 | 7/1994 |
| JP | 8-53186 | 2/1996 |

*Primary Examiner*—Donald W. Underwood
(74) *Attorney, Agent, or Firm*—Young & Thompson

(57) ABSTRACT

A jig for accommodating and transferring a carrier, the carrier having a first container with a first opening larger than the article, and the carrier having a first flange structure which extends from a peripheral portion of the first opening, the first flange structure having a first size defined to be a distance between opposite edges of the first flange structure in a first direction, the jig including a second container having a second opening with a second size larger than the first size of the first flange structure of the carrier, the jig further having a second flange structure in an opposite side to a side provided with the second opening, the second flange structure having a third size larger than the second size, the jig also having at least a window structure which extends at least opposite sides which is positioned adjacent to the second flange structure, so that the window structure is closer to the second opening than the second flange structure, the first opening of the carrier sealable with a part of an inner wall of the second container as the jig by making the first opening of the carrier contact with the part of the inner wall of the second container as the jig, and the window structure includes a flexible sheet deformable by an externally applied force.

12 Claims, 25 Drawing Sheets

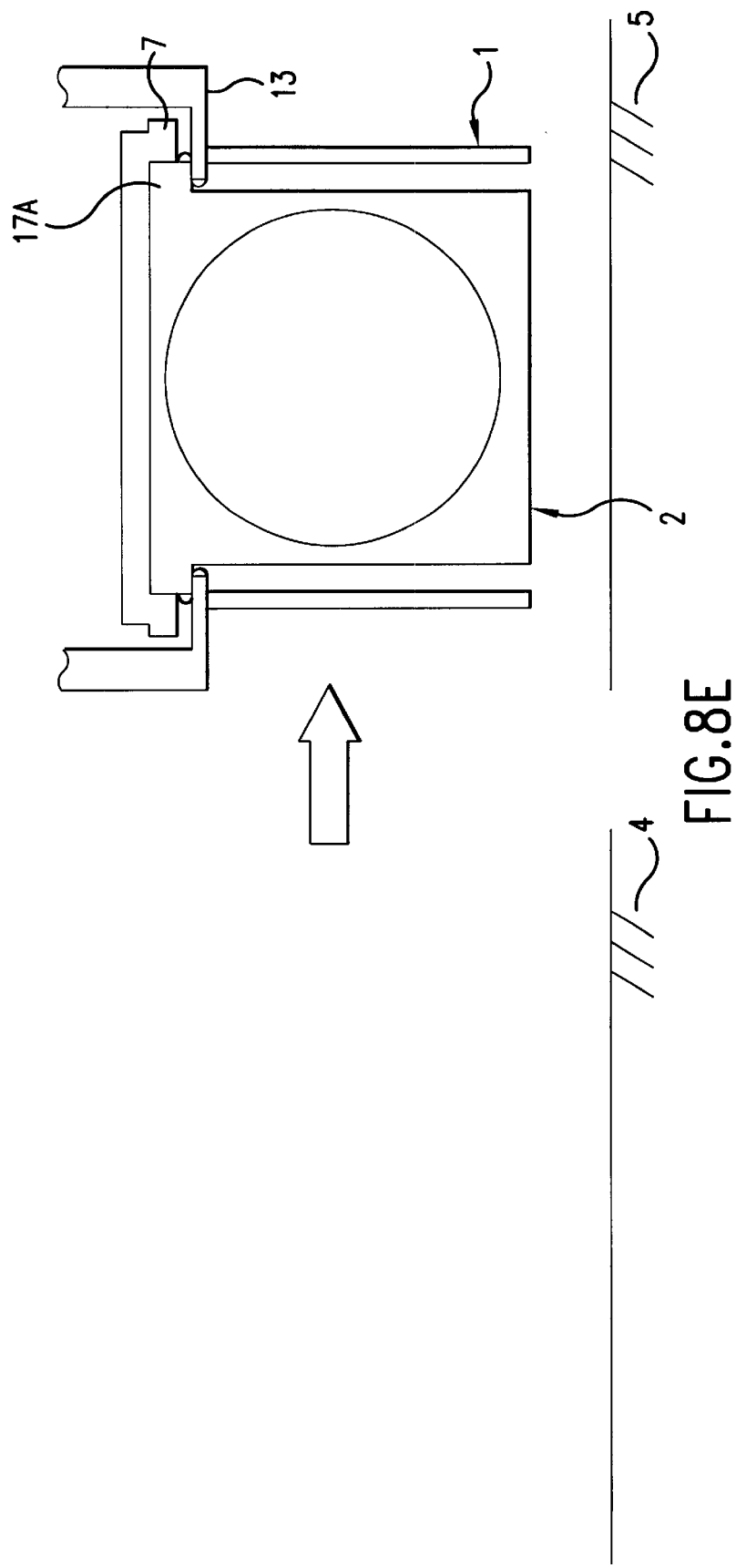

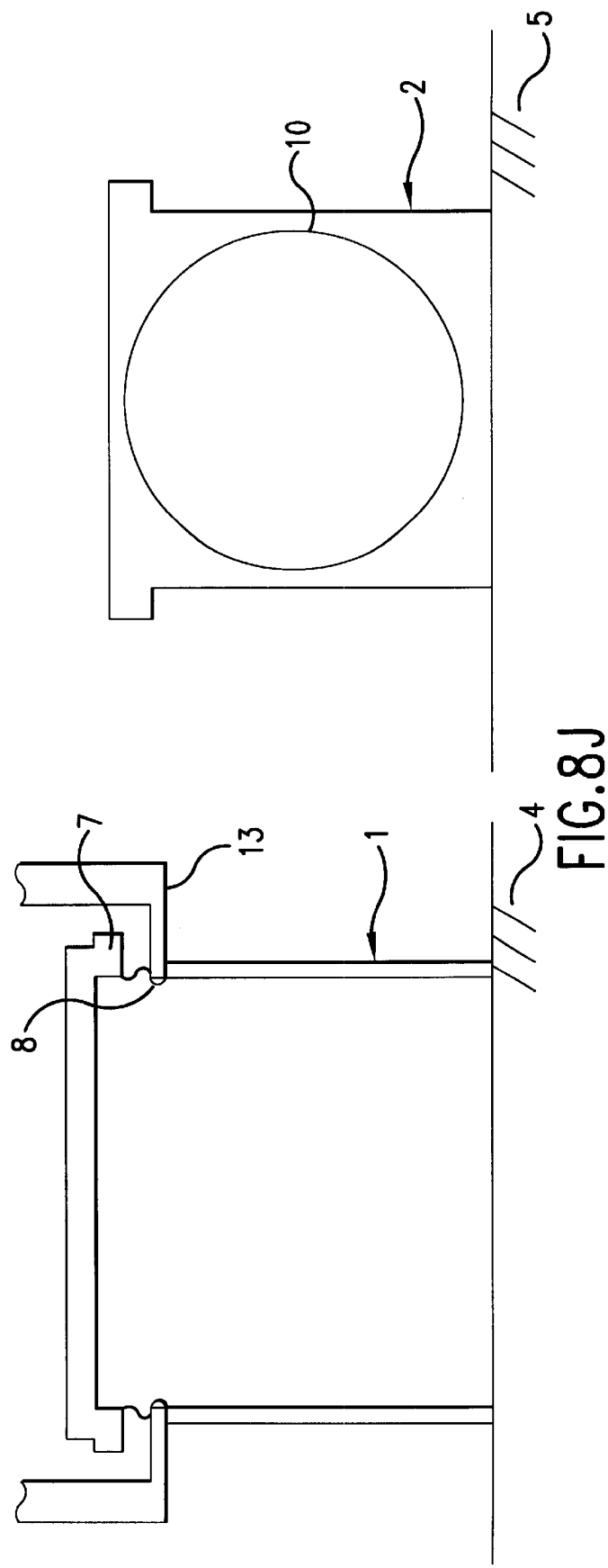

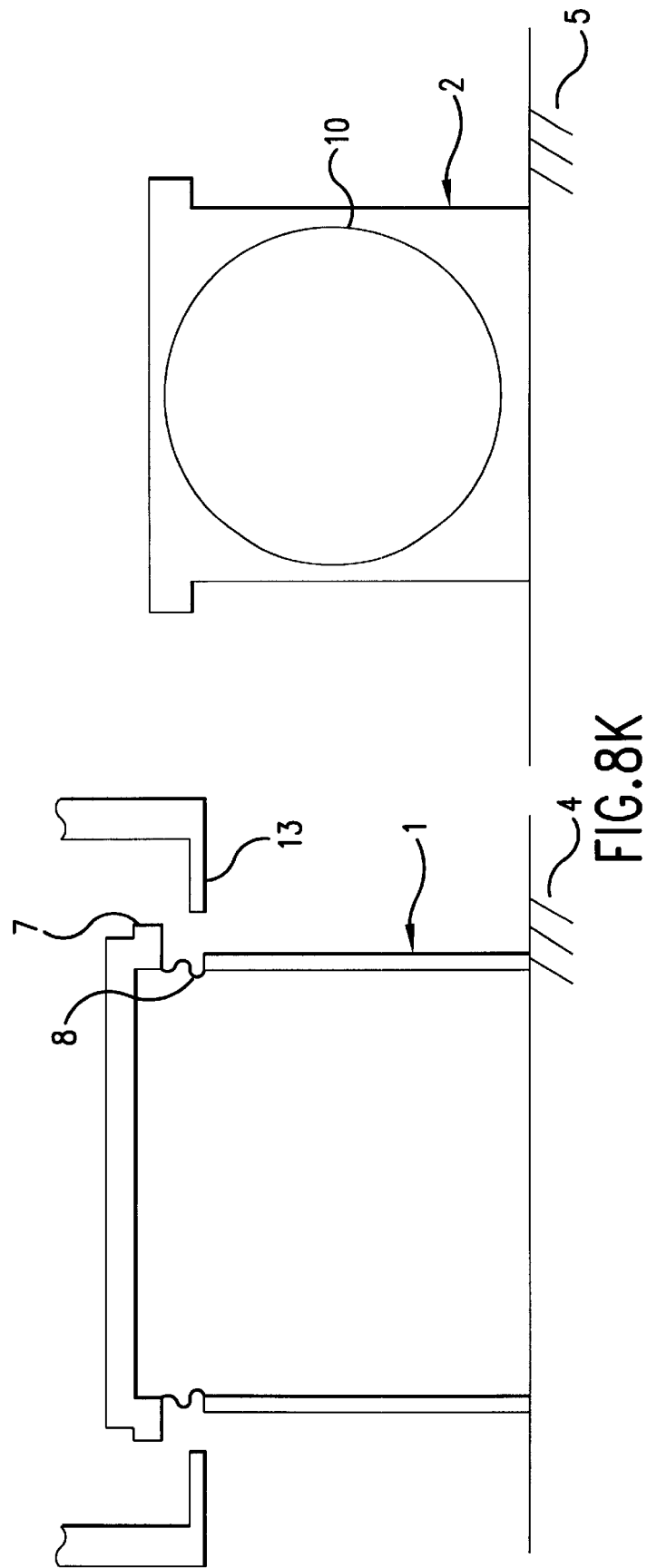

SEMICONDUCTOR WAFER ACCOMMODATING JIG, HANDLING METHOD AND PRODUCTION SYSTEM

CROSS-REFERENCE TO RELATED APPLICATIONS

This application is a division of application Ser. No. 09/229,446, filed Jan. 13, 1999 and now U.S. Pat. No. 6,247,597.

BACKGROUND OF THE INVENTION

The present invention relates to a semiconductor wafer accommodating jig, a handling method and a production system.

One of the serious issues in the processes for advanced semiconductor devices is that an adhesion of fine dusts on the semiconductor device might provide a fatal damage to the product, resulting in a drop of the yield, for which reason automation of the production line is made by taking into account of separation of the line from dusts or any for generating dusts. Actually, however, it is difficult to realize automatic maintenance and automatic trouble shooting systems, even human is the source for generating dusts.

To settle the above problems, it is effective to isolate the semiconductor device from atmosphere. In view of this, it was proposed to accommodate a carrier for the semiconductor device into a tightly shield box for realizing the automation. This is disclosed in Japanese laid-open utility model publication No. 59-83038. This method, however, provides a problem with complicated operations of the box so that the yield is dropped. Further, a long time accommodation of the carrier for the semiconductor wafer into the box causes another problem with generation of gas from the semiconductor wafer so that the box is filled with the gas, whereby the characteristics of the semiconductor wafer might be changed.

In the above circumstances, it has been required to improve the productivity of the semiconductor devices and to develop a high performance dust removing apparatus for removal of dusts as many as possible to reduce the probability of the adhesion of the dust on the semiconductor wafer. Except when the maintenance and the trouble shooting are carried out by person along with exposure of the semiconductor wafer to atmosphere including dusts, the semiconductor wafer is accommodated in a tightly shielding box for certain isolation of the semiconductor wafer from the atmosphere.

The descriptions will focus on a conventional method of transferring the carrier for semiconductor wafer to another transfer table with reference to FIGS. 1A and 1B. FIG. 1A is a view illustrative of a conventional carrier transfer system before transferring the carrier for semiconductor wafers from a first transfer table to a second transfer table involved in a conventional transfer method. FIG. 1B is a view illustrative of a conventional carrier transfer system after having transferred the carrier for semiconductor wafers from the first transfer table to the second transfer table involved in the conventional transfer method. A conventional carrier transfer system is to transfer a carrier 40 for semiconductor wafers 60 from a first transfer table 61 to a second transfer table 62. A box transfer device 63 is provided over the first transfer table 61. An opening and closing transfer system 64 is provided over the second transfer table 62. The opening and closing transfer system 64 has a carrier transfer device 66 positioned over the second transfer table 62 and an adsorber 65 positioned over the second transfer table 62. A box 50 is placed on the first transfer table 61. A carrier 40 for mounting a plurality of semiconductor wafers 60 is accommodated in the box 50. The carrier 40 has a carrier flange 41 for allowing the carrier transfer device 66 to catch the carrier flange 41. The box 50 comprises a box body 51 and a box cap 52 for sealing the carrier 40 in the box from atmosphere. The box 50 also has a box flange 53 for allowing the box transfer device 63 to catch the box flange 53. The box cap 52 is removed from or capped onto the box body 51 by the adsorber 65.

For carrier unloading operation, the box transfer device 63 is operated to move down to a lower level than the box flange 53 of the box 50 so that the box transfer device 63 is closed to catch the box flange 53 for rifting the box 50 up from the first transfer table 61. The box transfer device 63 is then moved toward the second transfer table 62, before the box transfer device 63 is fallen so that the box 50 is placed onto the second transfer table 62. The box transfer device 63 is opened to release the box 50. The box transfer device 63 is moved back to the original position over the first transfer table 61. In place, the opening and closing transfer system 64 is operated to move to a position over the box 50 placed on the second transfer table 62. The adsorber 65 is made into adsorption with the box cap 52 before the adsorber 65 is moved upwardly so as to rift the box cap 52 up from the box body 51, whereby the box cap 52 is opened. The carrier transfer device 66 is operated to move down to a lower level than the carrier flange 41 of the carrier 40 so that the carrier transfer device 66 is closed to catch the carrier flange 41 for rifting the carrier 40 up from the box 50. The carrier transfer device 66 is then moved toward other position than the box 50 but over the second transfer table 62, before the carrier transfer device 66 is fallen so that the carrier 40 is placed onto the other position than the box 50 but on the second transfer table 62. The box transfer device 63 over the original position over the first transfer table 61 is moved to a position over the second transfer table 62. The carrier transfer device 66 is opened to release the carrier 40. The box transfer device 63 is operated to move down to a lower level than the box flange 53 of the box 50 on the second transfer table 62 and concurrently the adsorber 65 with the box cap 52 is moved down onto the box 50 so that the box cap 52 is placed on the box body 51 of the box 50 before the adsorber 65 comes free of adsorption with the box cap 52 to release the box cap 52 from the adsorber 65, whereby the box cap 52 is capped on the box body 51 of the box 50. The adsorber 65 is moved upwardly to back to the original position over the second transfer table 62. Also the carrier transfer device 66 is moved upwardly to back to the original position over the second transfer table 62. Further, the box transfer device 63 is closed to catch the box flange 53 for rifting the box 50 up from the second transfer table 62. The box transfer device 63 is then moved from the second transfer table 62 toward the first transfer table 61, before the box transfer device 63 is fallen so that the box 50 is transferred back onto the first transfer table 61. The box transfer device 63 is opened to release the box 50 on the first transfer table 61. The box transfer device 63 is moved back to the original position over the first transfer table 61.

For carrier loading operation, the box transfer device 63 is operated to move down to a lower level than the box flange 53 of the box 50 so that the box transfer device 63 is closed to catch the box flange 53 for rifting the box 50 up from the first transfer table 61. The box transfer device 63 is then moved toward the second transfer table 62, before the box transfer device 63 is fallen so that the box 50 is placed onto other position than the carrier 40 on the second transfer table 62. The box transfer device 63 is opened to release the box 50. The box transfer device 63 is moved back to the original position over the first transfer table 61. In place, the opening and closing transfer system 64 is operated to move to a position over the box 50 placed on the second transfer table 62. The adsorber 65 is made into adsorption with the box cap 52 before the adsorber 65 is moved upwardly so as to rift the box cap 52 up from the box body 51, whereby the box cap 52 is opened. The carrier transfer device 66 is operated to move down to a lower level than the carrier flange 41 of the carrier 40 so that the carrier transfer device 66 is closed to catch the carrier flange 41 for rifting the carrier 40 up from the second transfer table 62. The carrier transfer device 66 is then moved toward a position over the box 50 on the second transfer table 62, before the carrier transfer device 66 is fallen onto the box 50 on the second transfer table 62, so that the carrier 40 is placed into the box body 51 of the box 50, whereby the carrier 40 is accommodated within the box body 51. The adsorber 65 with the box cap 52 is moved down onto the box 50 so that the box cap 52 is placed on the box body 51 of the box 50 before the adsorber 65 comes free of adsorption with the box cap 52 to release the box cap 52 from the adsorber 65, whereby the box cap 52 is capped on the box body 51 of the box 50. The adsorber 65 is moved upwardly to back to the original position over the second transfer table 62. Also the carrier transfer device 66 is moved upwardly to back to the original position over the second transfer table 62. The box transfer device 63 over the original position over the first transfer table 61 is moved to a position over the second transfer table 62. The box transfer device 63 is operated to move down to a lower level than the box flange 53 of the box 50 on the second transfer table 62. Further, the box transfer device 63 is closed to catch the box flange 53 for rifting the box 50 up from the second transfer table 62. The box transfer device 63 is then moved from the second transfer table 62 toward the first transfer table 61, before the box transfer device 63 is fallen so that the box 50 is moved onto the first transfer table 61. The box transfer device 63 is opened to release the box 50 on the first transfer table 61. The box transfer device 63 is moved back to the original position over the first transfer table 61.

FIG. 2 is a schematic perspective view illustrative of a conventional production line utilizing the above conventional carrier transfer system of FIGS. 1A and 1B. The conventional production line has a plurality of manufacturing equipments 71, a plurality of automatic carrier trucks 73, and an automatic rack 72. Each of the automatic carrier trucks 73 has a loading surface 76 for carrying the box 50 accommodating the carrier 40 for carrying a plurality of the semiconductor wafers 60. Each of the manufacturing equipments 71 has an entrance 74 which is provided with the opening and closing transfer system 64. The automatic rack 72 also has an entrance 75 which is provided with the opening and closing transfer system 64. Each of the automatic carrier trucks 73 has the box transfer device 63. The loading surface 76 of the automatic carrier truck 73 in FIG. 2 corresponds to the first transfer table 61 in FIGS. 1A and 1B. The entrance 74 of the manufacturing equipment 71 and the entrance 75 of the automatic rack 72 in FIG. 2 correspond to the second transfer table 62 in FIGS. 1A and 1B. The carrier loading and unloading operations between the loading surface 76 of the automatic carrier truck 73 and the entrances 74 and 75 are accomplished as described above with reference to FIGS. 1A and 1B.

The above conventional carrier transfer system has the following four disadvantages. The first disadvantage of the conventional carrier transfer system is that it takes a long time to carry the carrier and loading or unloading the carrier because it is necessary to open and close the box cap of the box and carry the box free of the carrier.

The second disadvantage is that an additional space for installation of the opening and closing transfer system having the carrier transfer device separately from the box transfer device.

The third disadvantage is that it is necessary to provide the opening and closing transfer systems for every manufacturing equipments, for which reason the production systems is expensive, resulting in the increased manufacturing cost. Further, a huge cost is necessary to improve the production system.

The fourth disadvantage is that a gas is generated from the semiconductor wafers so that the sealed box is filled with the gas, whereby the gas may provide influences to the characteristic of the semiconductor wafers due to a long time exposure of the semiconductor wafers to the generated gas.

In the above circumstances, it had been required to develop a novel semiconductor wafer accommodating jig, handling method and production system free from the above disadvantages.

SUMMARY OF THE INVENTION

Accordingly, it is an object of the present invention to provide a novel semiconductor wafer accommodating jig free from the above problems.

It is a further object of the present invention to provide a novel semiconductor wafer accommodating jig capable of concurrent operations of opening and closing the box cap and of carrying the carrier to shorten the necessary time for carrying the carrier and loading or unloading the carrier.

It is a still further object of the present invention to provide a novel semiconductor wafer accommodating jig suitable for reducing the necessary space for installation of the production system.

It is yet a further object of the present invention to provide a novel semiconductor wafer accommodating jig suitable for reducing the manufacturing cost.

It is a further more object of the present invention to provide a novel semiconductor wafer accommodating jig suitable for reducing the cost necessary for improving the production system.

It is still more object of the present invention to provide a novel semiconductor wafer accommodating jig rendering the manufacturing equipment simple in structure.

It is moreover object of the present invention to provide a novel semiconductor wafer accommodating jig rendering the semiconductor wafers free from adhesion of dusts provided by human.

It is another object of the present invention to provide a novel handing method for handling the novel semiconductor wafer accommodating jig free from the above problems.

It is still another object of the present invention to provide a novel handing method for handling the novel semiconductor wafer accommodating jig capable of concurrent operations of opening and closing the box cap and of carrying the carrier to shorten the necessary time for carrying the carrier and loading or unloading the carrier.

It is yet another object of the present invention to provide a novel handing method for handling the novel semiconductor wafer accommodating jig suitable for reducing the necessary space for installation of the production system.

It is further another object of the present invention to provide a novel handing method for handling the novel semiconductor wafer accommodating jig suitable for reducing the manufacturing cost.

It is an additional object of the present invention to provide a novel handing method for handling the novel semiconductor wafer accommodating jig suitable for reducing the cost necessary for improving the production system.

It is a still additional object of the present invention to provide a novel handing method for handling the novel semiconductor wafer accommodating jig rendering the manufacturing equipment simple in structure.

It is yet an additional object of the present invention to provide a novel handing method for handling the novel semiconductor wafer accommodating jig rendering the semiconductor wafers free from adhesion of dusts provided by human.

It is a further additional object of the present invention to provide a novel production system having a novel semiconductor wafer accommodating jig free from the above problems.

It is also additional object of the present invention to provide a novel production system having a novel semiconductor wafer accommodating jig capable of concurrent operations of opening and closing the box cap and of carrying the carrier to shorten the necessary time for carrying the carrier and loading or unloading the carrier.

It is also additional object of the present invention to provide a novel production system having a novel semiconductor wafer accommodating jig suitable for reducing the necessary space for installation of the production system.

It is also additional object of the present invention to provide a novel production system having a novel semiconductor wafer accommodating jig suitable for reducing the manufacturing cost.

It is also additional object of the present invention to provide a novel production system having a novel semiconductor wafer accommodating jig suitable for reducing the cost necessary for improving the production system.

It is also additional object of the present invention to provide a novel production system having a novel semiconductor wafer accommodating jig rendering the manufacturing equipment simple in structure.

It is also additional object of the present invention to provide a novel production system having a novel semiconductor wafer accommodating jig rendering the semiconductor wafers free from adhesion of dusts provided by human.

The first present invention provides a jig for accommodating and transferring a carrier for carrying at least an article, the carrier comprising a first container having a first opening larger than the article, and the carrier having at least a first flange structure which extends from a peripheral portion of the first opening, and the first flange structure having a first size defined to be a distance between opposite edges of the first flange structure in a first direction, wherein the jig comprises a second container having a second opening with a second size larger than the first size of the first flange structure of the carrier, and the jig further has at least a second flange structure in an opposite side to a side provided with the second opening, and the second flange structure has a third size larger than the second size, and the jig also has at least a window structure which extends at least opposite sides and which is positioned adjacent to the second flange structure, so that the window structure is closer to the second opening than the second flange structure, wherein the first opening of the carrier is sealable with a part of an inner wall of the second container as the jig by making the first opening of the carrier into contact with the part of the inner wall of the second container as the jig, and wherein the window structure comprises a flexible sheet deformable by an externally applied force.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIGS. 8A through 8L are cross sectional elevation views illustrative of sequential operations for transferring the carriers to be accommodated in the semiconductor wafer accommodating jig from the first transfer table to the second transfer table in the first embodiment in accordance with the present invention.

DISCLOSURE OF THE INVENTION

Figure 1A:
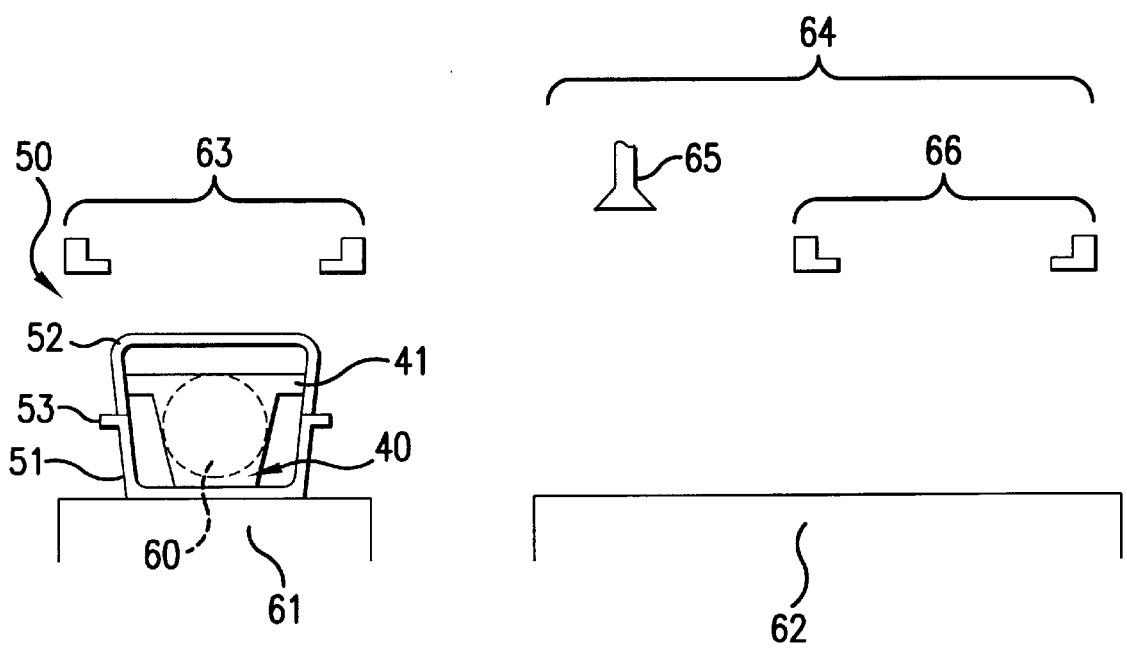
FIG. 1A is a view illustrative of a conventional carrier transfer system before transferring the carrier for semiconductor wafers from a first transfer table to a second transfer table involved in a conventional transfer method.
Figure 1B:
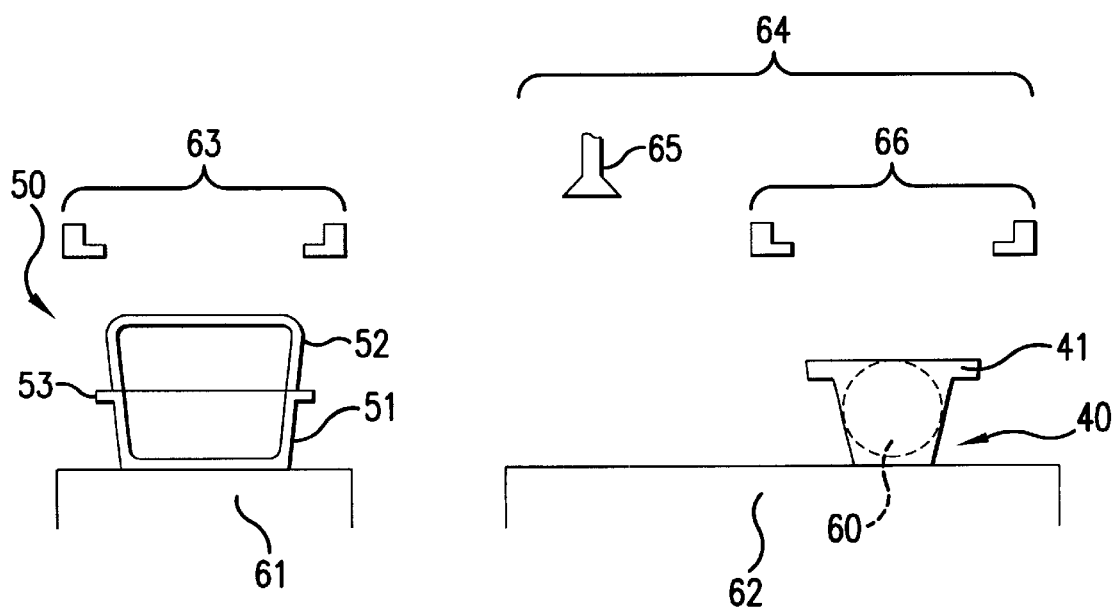
FIG. 1B is a view illustrative of a conventional carrier transfer system after having transferred the carrier for semiconductor wafers from the first transfer table to the second transfer table involved in the conventional transfer method.
Figure 2:
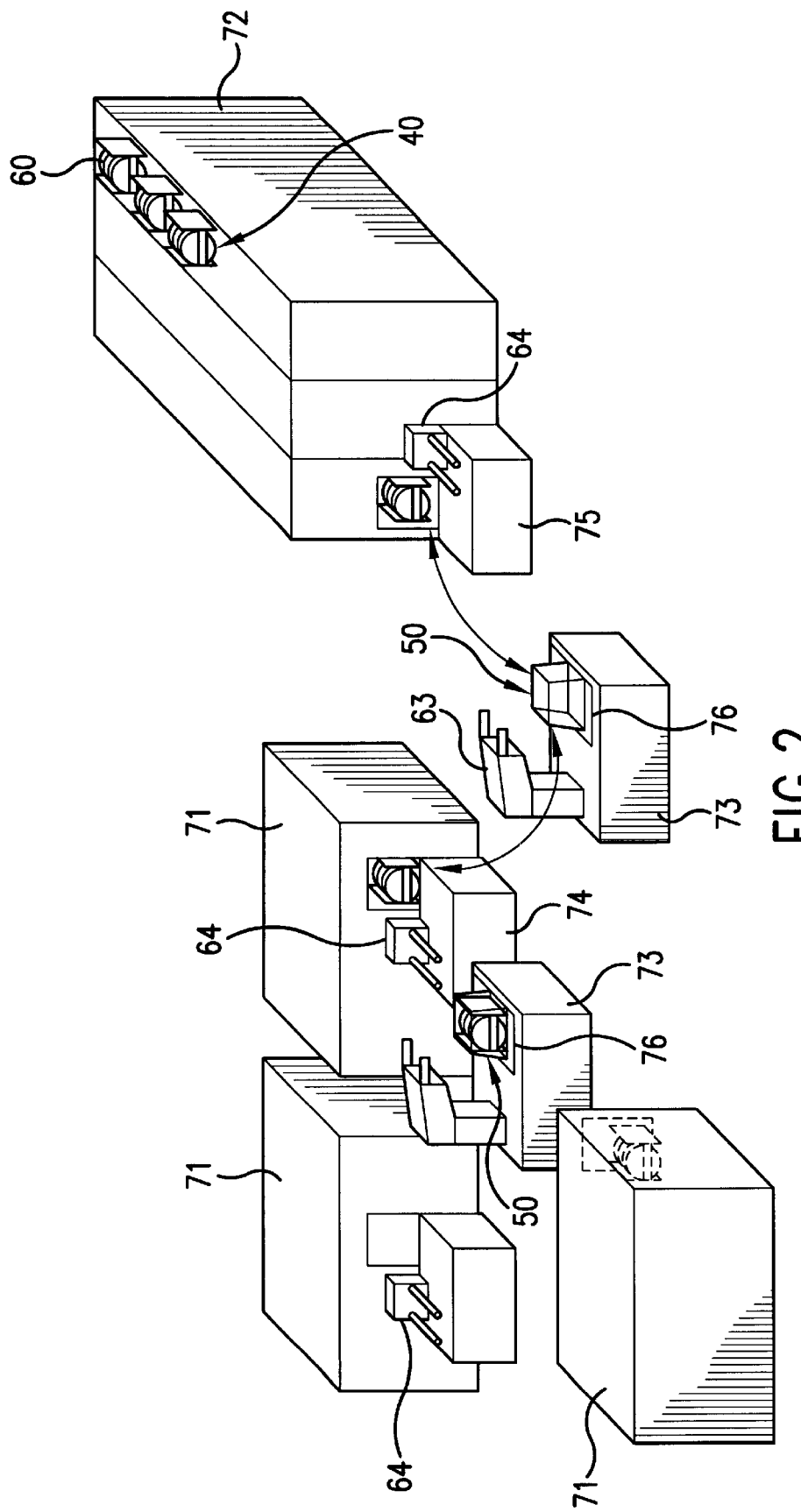
FIG. 2 is a schematic perspective view illustrative of a conventional production line utilizing the above conventional carrier transfer system of FIGS. 1A and 1B.

The first present invention provides a jig for accommodating and transferring a carrier for carrying at least an article, the carrier comprising a first container having a first opening larger than the article, and the carrier having at least a first flange structure which extends from a peripheral portion of the first opening, and the first flange structure having a first size defined to be a distance between opposite edges of the first flange structure in a first direction, wherein the jig comprises a second container having a second opening with a second size larger than the first size of the first flange structure of the carrier, and the jig further has at least a second flange structure in an opposite side to a side provided with the second opening, and the second flange structure has a third size larger than the second size, and the jig also has at least a window structure which extends at least opposite sides and which is positioned adjacent to the second flange structure, so that the window structure is closer to the second opening than the second flange structure, wherein the first opening of the carrier is sealable with a part of an inner wall of the second container as the jig by making the first opening of the carrier into contact with the part of the inner wall of the second container as the jig, and wherein the window structure comprises a flexible sheet deformable by an externally applied force.

It is preferable that the first container as the carrier has a rectangular parallelepiped shape comprising a bottom wall of four side walls, and the first flange comprises at least a pair of first flanges extending outwardly from a first pair of opposite sides of peripherals of the first opening, and that the second container as the jig also has a rectangular parallelepiped shape comprising a top wall and four side walls, and the second flange structure comprises at least a pair of second flanges extending outwardly from a first pair of opposite sides of the top wall, and the window structure comprises at least a pair of the flexible sheets provided in a first pair of opposite side walls of the four side walls so that the flexible sheets are positioned directly under the second flanges of the jig.

It is preferable that the top wall of the jig has an inner face downwardly and the inner face has an oblique angle to a flat level, and outer faces of the first flanges have the same oblique angle so that the outer faces of the first flanges of the carrier are parallel to the inner face of the top wall of the jig.

It is preferable that the top wall of the jig has an outer face upwardly and the outer face is parallel to the flat level, so that the top wall varies in thickness in a lateral direction.

It is preferable that at least one of second paired opposite side walls of the four side walls has an inner face with an oblique angle to a vertical plane, and outer faces of the first flanges have the same oblique angle so that the outer faces of the first flanges of the carrier are parallel to the inner face of the top wall of the jig.

It is preferable that the at least one of second paired opposite side walls of the jig has an outer face parallel to the vertical plane, so that the at least one of second paired opposite side walls varies in thickness in a vertical direction.

The second present invention provides a jig for accommodating and transferring a carrier for carrying at least an article, wherein the jig comprises a container having an opening and at least a second flange structure in an opposite side to a side provided with the opening, and at least a window structure adjacent to the flange structure, so that the window structure is closer to the opening than the flange structure, and the window structure comprises a flexible sheet deformable by an externally applied force.

It is preferable that the container as the jig has a rectangular parallelepiped shape comprising a top wall and four side walls, and the flange structure comprises at least a pair of flanges extending outwardly from a first pair of opposite sides of the top wall, and the window structure comprises at least a pair of the flexible sheets provided in a first pair of opposite side walls of the four side walls so that the flexible sheets are positioned directly under the flanges of the jig.

It is preferable that the top wall of the jig has an inner face downwardly and the inner face has an oblique angle to a flat level.

It is preferable that the top wall of the jig has an outer face upwardly and the outer face is parallel to the flat level, so that the top wall varies in thickness in a lateral direction.

It is preferable that at least one of second paired opposite side walls of the four side walls has an inner face with an oblique angle to a vertical plane.

It is preferable that the at least one of second paired opposite side walls of the jig has an outer face parallel to the vertical plane, so that the at least one of second paired opposite side walls varies in thickness in a vertical direction.

The third present invention provides a transfer system comprising: a transfer device having at least a pair of claws adjustable in a distance between inside edges of the claws; a carrier for carrying at least an article, the carrier comprising a first container having a first opening larger than the article, and the carrier having at least a first flange structure which extends from a peripheral portion of the first opening, and the first flange structure having a first size defined to be a distance between opposite edges of the first flange structure in a first direction; and a jig comprising a second container having a second opening with a second size larger than the first size of the first flange structure of the carrier, and the jig further having at least a second flange structure in an opposite side to a side provided with the second opening, and the second flange structure having a third size larger than the second size, and the jig also having at least a window structure which extends at least opposite sides and which is positioned adjacent to the second flange structure, so that the window structure is closer to the second opening than the second flange structure, wherein the first opening of the carrier is sealable with a part of an inner wall of the second container as the jig by making the first opening of the carrier into contact with the part of the inner wall of the second container as the jig, and wherein the window structure comprises flexible sheets deformable by pushing the claws to the flexible sheets.

It is preferable that the first container as the carrier has a rectangular parallelepiped shape comprising a bottom wall of four side walls, and the first flange comprises at least a pair of first flanges extending outwardly from a first pair of opposite sides of peripherals of the first opening, and wherein the second container as the jig also has a rectangular parallelepiped shape comprising a top wall and four side walls, and the second flange structure comprises at least a pair of second flanges extending outwardly from a first pair of opposite sides of the top wall, and the window structure comprises at least a pair of the flexible sheets provided in a first pair of opposite side walls of the four side walls so that the flexible sheets are positioned directly under the second flanges of the jig.

It is preferable that the top wall of the jig has an inner face downwardly and the inner face has an oblique angle to a flat level, and outer faces of the first flanges have the same oblique angle so that the outer faces of the first flanges of the carrier are parallel to the inner face of the top wall of the jig.

It is preferable that the top wall of the jig has an outer face upwardly and the outer face is parallel to the flat level, so that the top wall varies in thickness in a lateral direction.

It is preferable that at least one of second paired opposite side walls of the four side walls has an inner face with an oblique angle to a vertical plane, and outer faces of the first flanges have the same oblique angle so that the outer faces of the first flanges of the carrier are parallel to the inner face of the top wall of the jig.

It is preferable that the at least one of second paired opposite side walls of the jig has an outer face parallel to the vertical plane, so that the at least one of second paired opposite side walls varies in thickness in a vertical direction.

The fourth present invention provides a semiconductor wafer production system including a transfer system comprising: a transfer device having at least a pair of claws adjustable in a distance between inside edges of the claws; a carrier for carrying at least an article, the carrier comprising a first container having a first opening larger than the article, and the carrier having at least a first flange structure which extends from a peripheral portion of the first opening, and the first flange structure having a first size defined to be a distance between opposite edges of the first flange structure in a first direction; and a jig comprising a second container having a second opening with a second size larger than the first size of the first flange structure of the carrier, and the jig further having at least a second flange structure in an opposite side to a side provided with the second opening, and the second flange structure having a third size larger than the second size, and the jig also having at least a window structure which extends at least opposite sides and which is positioned adjacent to the second flange structure, so that the window structure is closer to the second opening than the second flange structure, wherein the first opening of the carrier is sealable with a part of an inner wall of the second container as the jig by making the first opening of the carrier into contact with the part of the inner wall of the second container as the jig, and wherein the window structure comprises flexible sheets deformable by pushing the claws to the flexible sheets.

It is preferable that the first container as the carrier has a rectangular parallelepiped shape comprising a bottom wall of four side walls, and the first flange comprises at least a pair of first flanges extending outwardly from a first pair of opposite sides of peripherals of the first opening, and that the second container as the jig also has a rectangular parallelepiped shape comprising a top wall and four side walls, and the second flange structure comprises at least a pair of second flanges extending outwardly from a first pair of opposite sides of the top wall, and the window structure comprises at least a pair of the flexible sheets provided in a first pair of opposite side walls of the four side walls so that the flexible sheets are positioned directly under the second flanges of the jig.

It is preferable that the top wall of the jig has an inner face downwardly and the inner face has an oblique angle to a flat level, and outer faces of the first flanges have the same oblique angle so that the outer faces of the first flanges of the carrier are parallel to the inner face of the top wall of the jig.

It is preferable that the top wall of the jig has an outer face upwardly and the outer face is parallel to the flat level, so that the top wall varies in thickness in a lateral direction.

It is preferable that at least one of second paired opposite side walls of the four side walls has an inner face with an oblique angle to a vertical plane, and outer faces of the first flanges have the same oblique angle so that the outer faces of the first flanges of the carrier are parallel to the inner face of the top wall of the jig.

It is preferable that the at least one of second paired opposite side walls of the jig has an outer face parallel to the vertical plane, so that the at least one of second paired opposite side walls varies in thickness in a vertical direction.

PREFERRED EMBODIMENTS

FIRST EMBODIMENT

Figure 3:
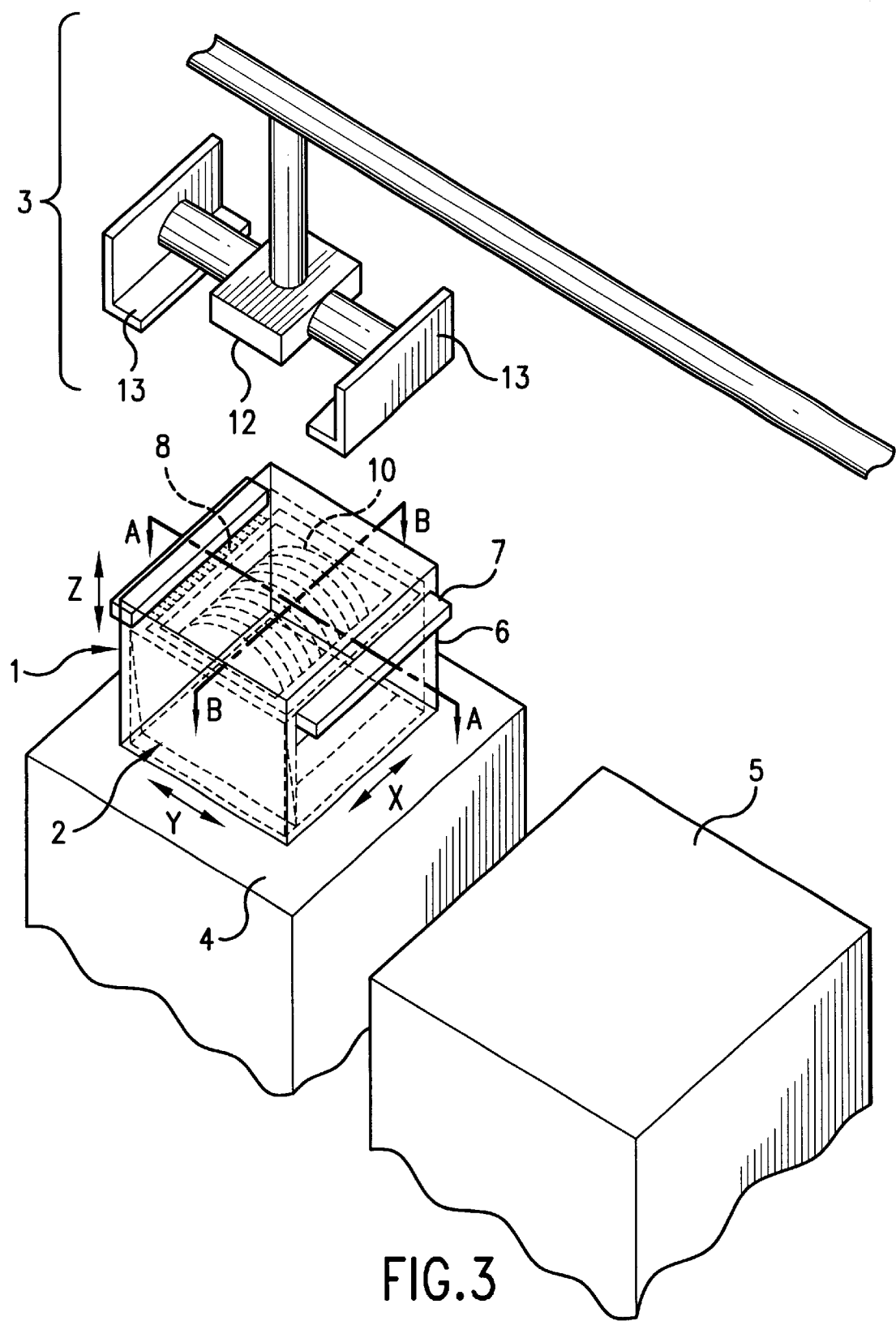
FIG. 3 is a schematic perspective view illustrative of a novel semiconductor wafer accommodating jig and a jig transfer device in a first embodiment in accordance with the present invention.
Figure 4A:
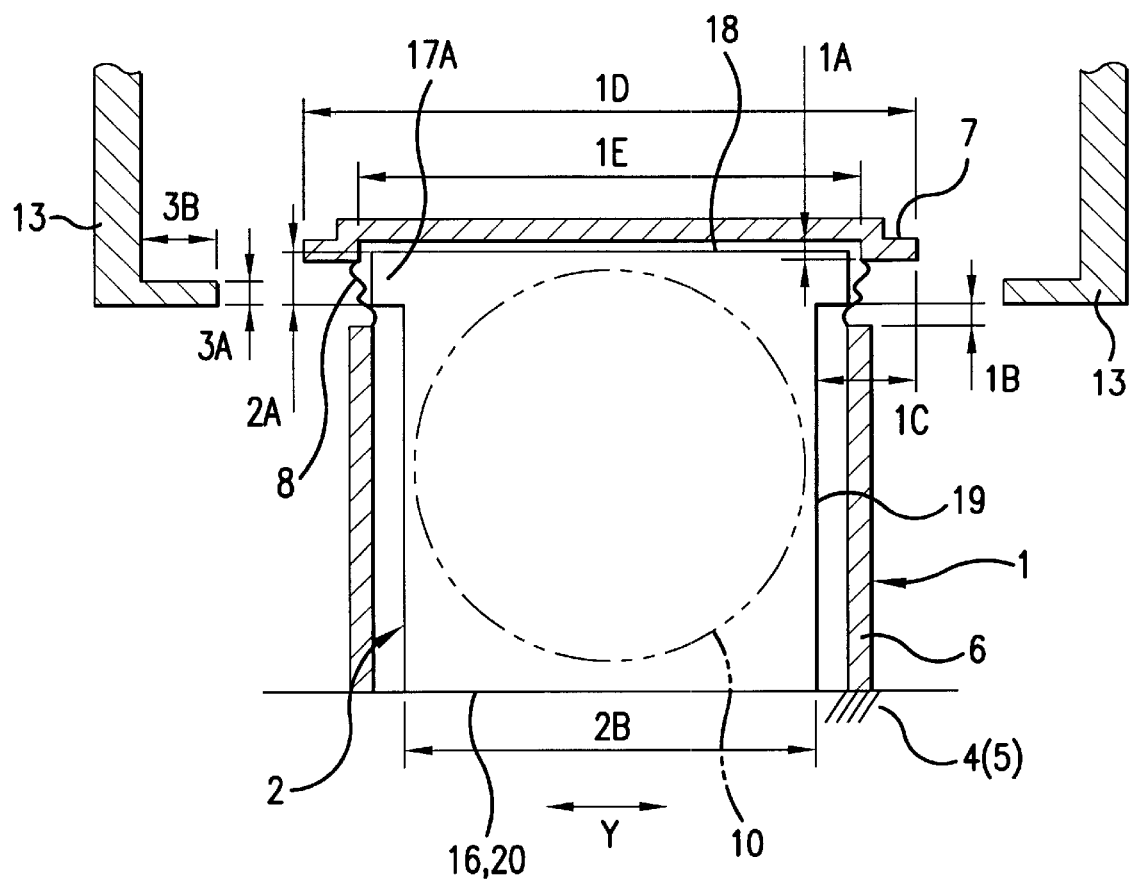
FIG. 4A is a cross sectional elevation view illustrative of a novel semiconductor wafer accommodating jig taken along a direction of arrow mark "Y" of FIG. 3 in a first embodiment in accordance with the present invention.
Figure 4B:
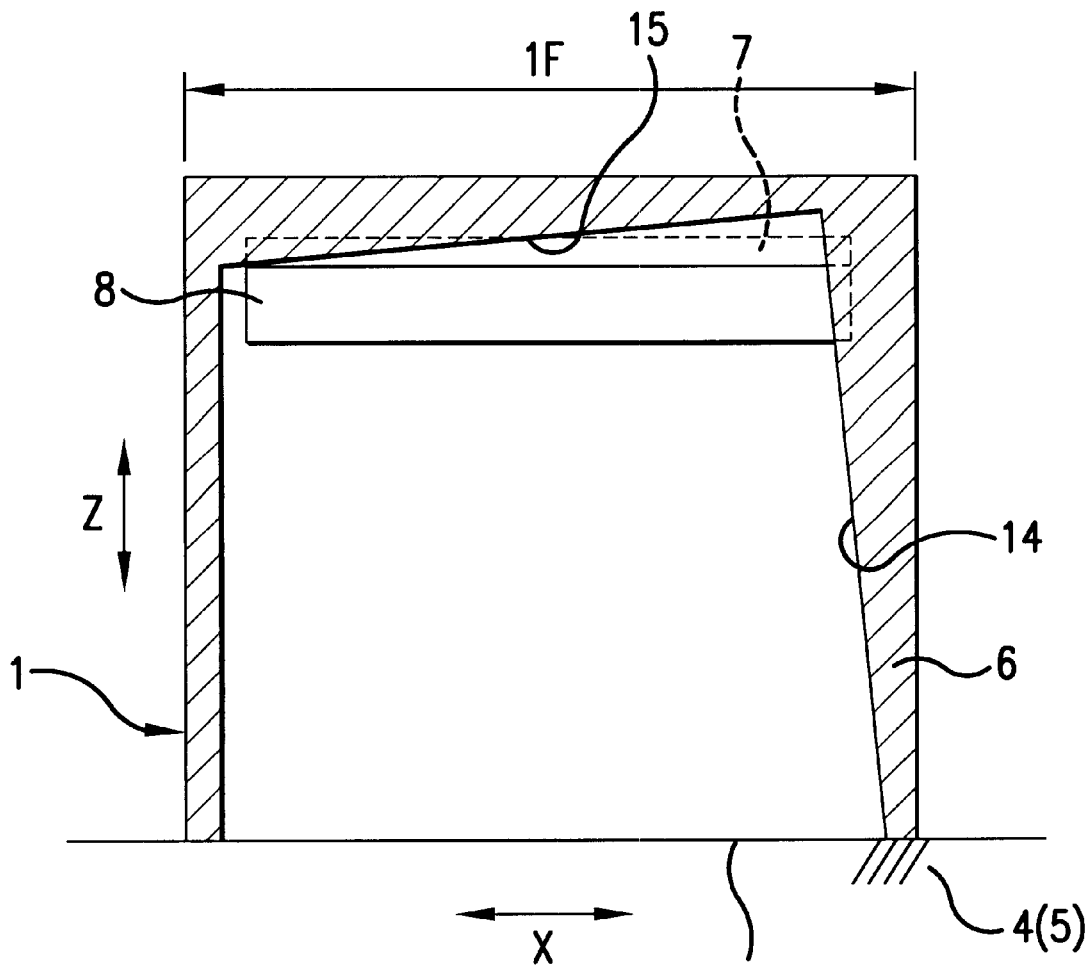
FIG. 4B is a cross sectional elevation view illustrative of a novel semiconductor wafer accommodating jig taken along a direction of arrow mark "X" of FIG. 3 in a first embodiment in accordance with the present invention.
Figure 5:
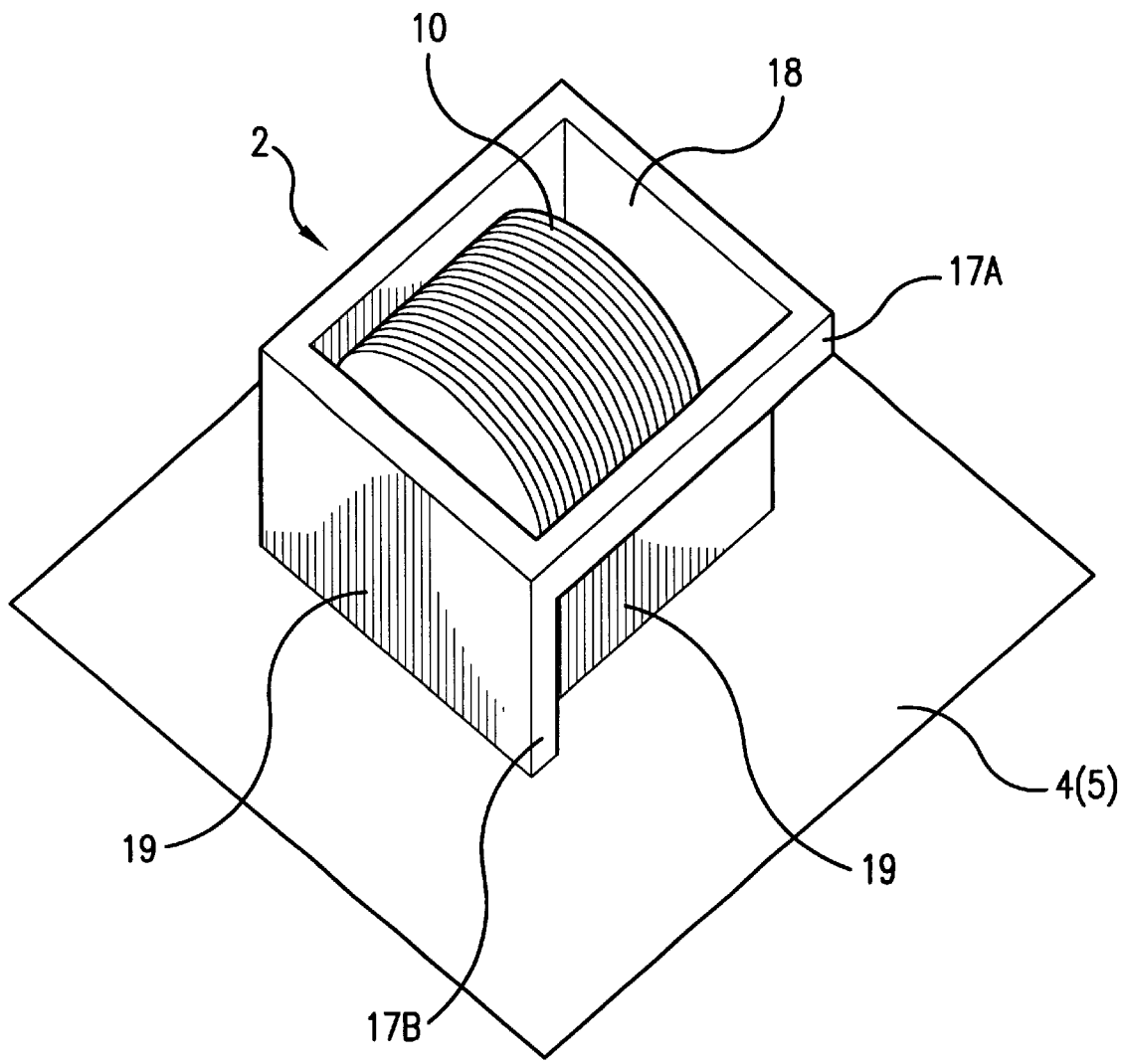
FIG. 5 is a schematic perspective view illustrative of a carrier for semiconductor wafers to be accommodated in a novel semiconductor wafer accommodating jig and to be transferred by a jig transfer device of FIG. 3 in a first embodiment in accordance with the present invention.

A first embodiment according to the present invention will be described in detail with reference to FIGS. 3, 4A and 4B and 5. FIG. 3 is a schematic perspective view illustrative of a novel semiconductor wafer accommodating jig and a jig transfer device in a first embodiment in accordance with the present invention. FIG. 4A is a cross sectional elevation view illustrative of a novel semiconductor wafer accommodating jig taken along a direction of arrow mark "Y" of FIG. 3 in a first embodiment in accordance with the present invention. FIG. 4B is a cross sectional elevation view illustrative of a novel semiconductor wafer accommodating jig taken along a direction of arrow mark "X" of FIG. 3 in a first embodiment in accordance with the present invention. FIG. 5 is a schematic perspective view illustrative of a carrier for semiconductor wafers to be accommodated in a novel semiconductor wafer accommodating jig and to be transferred by a jig transfer device of FIG. 3 in a first embodiment in accordance with the present invention.

With reference to FIG. 3, a novel semiconductor wafer accommodating jig 1 in accordance with the present invention is placed on a flat top surface of a first transfer table 4. The semiconductor wafer accommodating jig 1 comprises a bottom-free cubic-shaped cover 6 which forms a bottom-free cubic box. The bottom free cubic-shaped cover 6 has a top face, a first pair of opposite side faces distanced from each other in an X-axis direction and a second pair of opposite side faces distanced from each other in a Y-axis direction. Each of the second paired opposite side faces of the bottom free cubic-shaped cover 6 has a window 8 made of a flexible material and a flange 7 extending outwardly and over the window 8. A transfer device 3 comprises a control section 12 and a pair of L-shaped claws 13 for hooking the flanges 7 of the semiconductor wafer accommodating jig 1. A carrier 2 for a plurality of semiconductor wafers 10 is covered by the bottom free cubic-shaped cover 6. The transfer device 3 is movable between first and second transfer tables 4 and 5. The normal direction to the flat top surface of the first and second transfer tables 4 and 5 is Z-axis.

With reference to FIG. 4A, the carrier 2 for carrying a plurality of the semiconductor wafers 10 is accommodated within or covered by the bottom-free cubic-shaped cover 6 as the semiconductor wafer accommodating jig 1. The semiconductor wafer accommodating jig 1 has the second paired opposite side walls which have the windows 8 made of flexible materials and the flanges 7. The bottom-free cubic-shaped cover 6 has an opening bottom 16. Namely, the bottom free cubic-shaped cover 6 has the top wall, the first pair of the opposite side walls distanced form each other in the X-axis direction and the second pair of opposite side walls distanced form each other in the Y-axis direction as well as the opening bottom 16. The semiconductor wafer accommodating jig 1 or the bottom-free cubic-shaped cover 6 and the flanges 7 are made of a material which generates no dust, for example, polypropylene. Each of the windows 8 comprises an opening which is covered with a flexible sheet which is adhered with an adhesive to the peripheral portions of the opening, wherein the flexible sheet is made of a material which generates no dust, for example, silicone rubber, so as to allow the claws 13 of the transfer device 3 to push the flexible sheets into the openings so that the inside edges of the claws 13 also enter into the openings.

Meanwhile, the carrier 2 comprises a top-free cubic-shaped box which comprises an opening top 18, a bottom 20 and four side walls 19. The semiconductor wafers 10 are entered through the opening top 18 into the carrier 2 and are picked out through the opening top 18 from the carrier 2. The semiconductor wafer accommodating jig 1 has a first dimension 1D defined to be a distance between opposite edges of the flanges 7. The semiconductor wafer accommodating jig 1 also has a second dimension 1E defined to be a distance between opposite inner walls of the semiconductor wafer accommodating jig 1. The carrier 2 has a third dimension 2B defined to be a distance between opposite outer walls of the carrier 2. It is an example that the first dimension 1D is 250 millimeters, the second dimension 1E is 210 millimeters and the third dimension 2B is 200 millimeters. The control section 12 of the transfer device 3 controls a distance between the inside edges of the L-shaped claws 13. If the distance between the inside edges of the L-shaped claws 13 is larger than the first dimension 1D, then the L-shaped claws 13 are in the opening state for releasing the semiconductor wafer accommodating jig 1. If the distance between the inside edges of the L-shaped claws 13 is smaller than the first dimension 1D and larger than the second dimension 1E, then the L-shaped claws 13 are hooking the flanges 7 of the semiconductor wafer accommodating jig 1. If the distance between the inside edges of the L-shaped claws 13 is smaller than the second dimension 1E and larger than the third dimension 2B, then the L-shaped claws 13 are hooking the carrier 2 accommodated in the semiconductor wafer accommodating jig 1, wherein the inside edges of the L-shaped claws 13 push the flexible sheets of the windows 8 into the openings so that the inside edges of the L-shaped claws 13 enter into the openings. The semiconductor wafer accommodating jig 1 also has a fourth dimension 1A defined between an inside face of the top wall of the bottom-free cubic-shaped cover 6 and bottom faces of the flanges 7. The semiconductor wafer accommodating jig 1 also has a fifth dimension 2A defined to be a thickness of flanges 17A of the carrier 2. The L-shaped claws 13 have a sixth dimension 3A defined by a thickness of the inwardly and laterally extending hook portions of the L-shaped claws 13 as well as a seventh dimension 3B defined by a length of the inwardly and laterally extending hook portion. An eighth dimension 1C is defined between an outside edge of the flange 7 of the bottom-free cubic-shaped cover 6 of the of the semiconductor wafer accommodating jig 1 and an outside face of the side wall of the carrier 2. A ninth dimension 1B is defined between the bottom of the carrier flange 17A of the carrier 2 and a bottom of the window 8 of the bottom-free cubic-shaped cover 6 of the semiconductor wafer accommodating jig 1. It is important that the fourth dimension 1A defined between the inside face of the top wall of the bottom-free cubic-shaped cover 6 and the bottom faces of the flanges 7 is smaller than the fifth dimension 2A defined to be the thickness of flanges 17A of the carrier 2, even if the top of the carrier 2 is made into contact with the inner face of the top wall of the bottom-free cubic-shaped cover 6 of the semiconductor wafer accommodating jig 1, then the bottom of the carrier flanges 17A lies the lower level than the bottom of the flanges of the bottom-free cubic-shaped cover 6 of the semiconductor wafer accommodating jig 1. It is also important that the seventh dimension 3B defined by the length of the inwardly and laterally extending hook portion of the L-shaped claw 13 is larger than the eighth dimension 1C defined between the outside edge of the flange 7 of the bottom-free cubic-shaped cover 6 of the of the semiconductor wafer accommodating jig 1 and the outside face of the side wall of the carrier 2, so that if the L-shaped claws 13 are closed, then the inside edges of the inwardly and laterally extending hook portions of the L-shaped claws 13 reach the bottoms of the carrier flanges 17A and also the outside faces of the side walls of the carrier 2. It is also important that the ninth dimension 1B defined between the bottom of the carrier flange 17A of the carrier 2 and the bottom of the window 8 of the bottom-free cubic-shaped cover 6 of the semiconductor wafer accommodating jig 1 is larger than the sixth dimension 3A defined by the thickness of the inwardly and laterally extending hook portions of the L-shaped claws 13, so that if the L-shaped claws 13 are closed, then the inside edges of the inwardly and laterally extending hook portions of the L-shaped claws 13 are allowed to move into positions under the bottoms of the carrier flanges 17A. It is an example that the fourth dimension 1A is 20 millimeters, the fifth dimension 2A is 25 millimeters, the ninth dimension 1B is 12 millimeters, the eighth dimension 1C is 40 millimeters, the sixth dimension 3A is 10 millimeters, and the seventh dimension 3B is 50 millimeters as well as the bottoms of the windows 8 lie a level of 163 millimeters from the top flat surface of the first or second transfer table 4 or 5.

With reference to FIG. 4B, when the semiconductor wafer accommodating jig 1 is placed on the flat surface of the first or second transfer table 4 or 5, one of the first paired opposite side walls of the bottom-free cubic-shaped cover 6 of the semiconductor wafer accommodating jig 1 has an oblique inner face 14 and a vertical outer face so that a thickness of the one of the first paired opposite side walls proportionally decreases toward the downwardly. Namely, the bottom-free cubic-shaped cover 6 of the semiconductor wafer accommodating jig 1 has a thickness-varied side wall having the oblique inner face 14 which is oblique to the vertical outer face by an oblique angle θ. The bottom-free cubic-shaped cover 6 of the semiconductor wafer accommodating jig 1 has the top wall which is defined by a flat outer face and an oblique inner face 15 so that a thickness of the top wall decreases toward the thickness-varied side wall. Namely, the bottom-free cubic-shaped cover 6 of the semiconductor wafer accommodating jig 1 has a thickness-varied top wall having the oblique inner face 15 which is oblique to the flat outer face by an oblique angle θ. The bottom-free cubic-shaped cover 6 of the semiconductor wafer accommodating jig 1 has a first size 1F which is defined o be a length thereof along the X-axis direction. Each of the windows 8 is a rectangular-shaped to have a size of 25 mm×180 mm.

With reference to FIG. 5, the carrier 2 has a first carrier flange 17A extending outwardly from a peripheral portion of the top of the four side walls so that a square-shaped inside edge of the first carrier flange 17A defines a square-shaped carrier top opening 18. The first carrier flange 17A has an oblique outer and upper face which is oblique to the flat face by the oblique angle θ and a flat bottom face so that a thickness of the first carrier flange 17A proportionally increases. The carrier 2 has a second carrier flange 17B extending outwardly from a peripheral portion of the side wall toward which the thickness of the first carrier flange 17A proportionally decreases. The first carrier flange 17A of the carrier 2 is to be hooked by the claws 13 for transferring the carrier 2 directed so that the semiconductor wafers are aligned in the lateral direction. The second carrier flange 17B of the carrier 2 is to be hooked by the claws 13 for transferring the carrier 2 directed so that the semiconductor wafers are stacked in the vertical direction.

FIGS. 6A through 6D are cross sectional elevation views illustrative of an operation of lifting the novel semiconductor wafer accommodating jig accommodating the carrier for subsequent transferring the semiconductor wafer accommodating jig together with the carrier directed so that the semiconductor wafers in the carrier are aligned in the lateral direction in the first embodiment in accordance with the present invention.

Figure 6A:
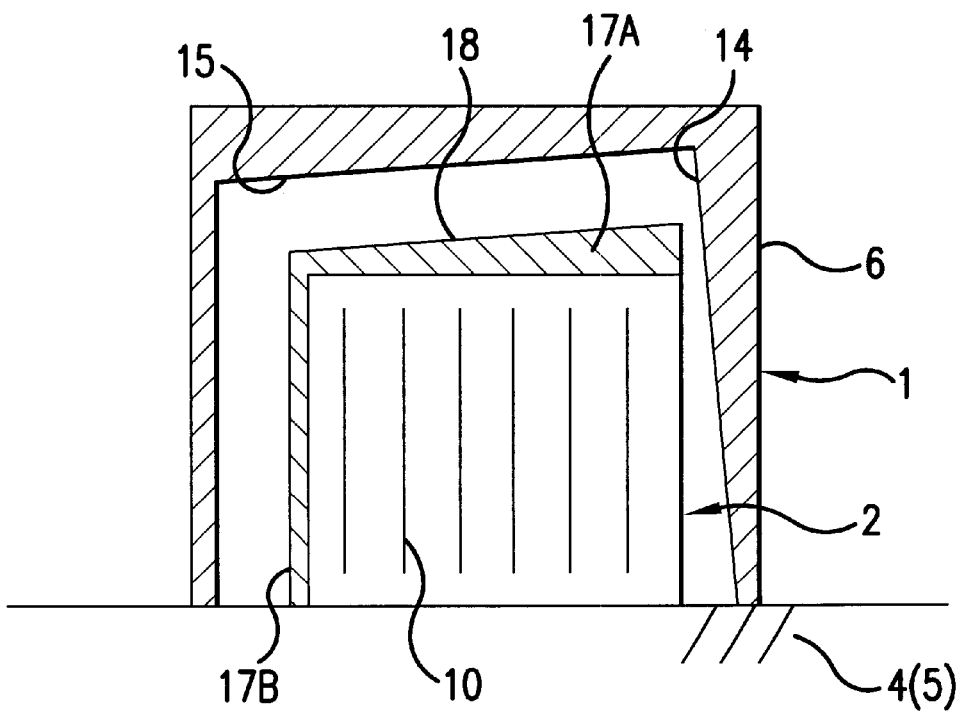
FIGS. 6A through 6D are cross sectional elevation views illustrative of an operation of lifting the novel semiconductor wafer accommodating jig accommodating the carrier for subsequent transferring the semiconductor wafer accommodating jig together with the carrier directed so that the semiconductor wafers in the carrier are aligned in the lateral direction in the first embodiment in accordance with the present invention.

With reference to FIG. 6A, the carrier 2 is accommodated in the bottom-free cubic-shaped cover 6 of the semiconductor wafer accommodating jig 1 so that the carrier 2 is directed so that the semiconductor wafers in the carrier are aligned in the lateral direction, wherein the first flange 17A of the carrier is positioned top, and the thickness of the first carrier flange 17A proportionally increases toward the oblique inner face 14 of the thickness-varied side wall of the bottom-free cubic-shaped cover 6 of the semiconductor wafer accommodating jig 1. The oblique outer and upper face 18 of the thickness-varied first flange 17 of the carrier 2 faces to the oblique inner and bottom face 15 of the thickness-varied top wall of the bottom-free cubic-shaped cover 6 of the semiconductor wafer accommodating jig 1, wherein the thickness of the top wall of the bottom-free cubic-shaped cover 6 of the semiconductor wafer accommodating jig 1 decreases toward the oblique inner face 14 of the thickness-varied side wall of the bottom-free cubic-shaped cover 6 of the semiconductor wafer accommodating jig 1, whereby the oblique outer and upper face 18 of the thickness-varied first flange 17 of the carrier 2 is parallel to the oblique inner and bottom face 15 of the thickness-varied top wall of the bottom-free cubic-shaped cover 6 of the semiconductor wafer accommodating jig 1. The carrier 2 and the bottom-free cubic-shaped cover 6 of the semiconductor wafer accommodating jig 1 are placed on the flat surface of the first or second transfer table 4 or 5 so that the carrier 2 has no contact with the bottom-free cubic-shaped cover 6 of the semiconductor wafer accommodating jig 1.

Figure 6B:
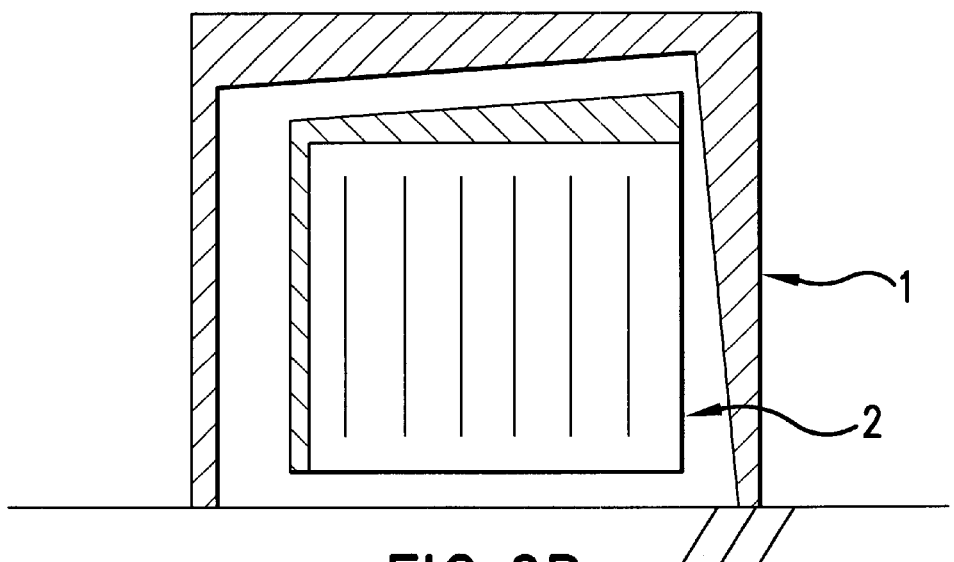

With reference to FIG. 6B, the L-shaped claws 13 are closed so that the distance between the inside edges of the L-shaped claws 13 comes smaller than the second dimension 1E and larger than the third dimension 2B, wherein the inside edges of the L-shaped claws 13 push the flexible sheets of the windows 8 into the openings and the inside edges of the L-shaped claws 13 enter into the openings, whereby the inside edges of the inwardly and laterally extending hook portions of the L-shaped claws 13 reach the bottoms of the carrier flanges 17A and also reach the outside faces of the side walls of the carrier 2, resulting in that the L-shaped claws 13 are hooking the first flange 17A of the carrier 2 accommodated in the semiconductor wafer accommodating jig 1. The transfer device 3 is moved upwardly so that the L-shaped claws 13 hooking the first flange 17A of the carrier 2 lift up the carrier 2.

Figure 6C:
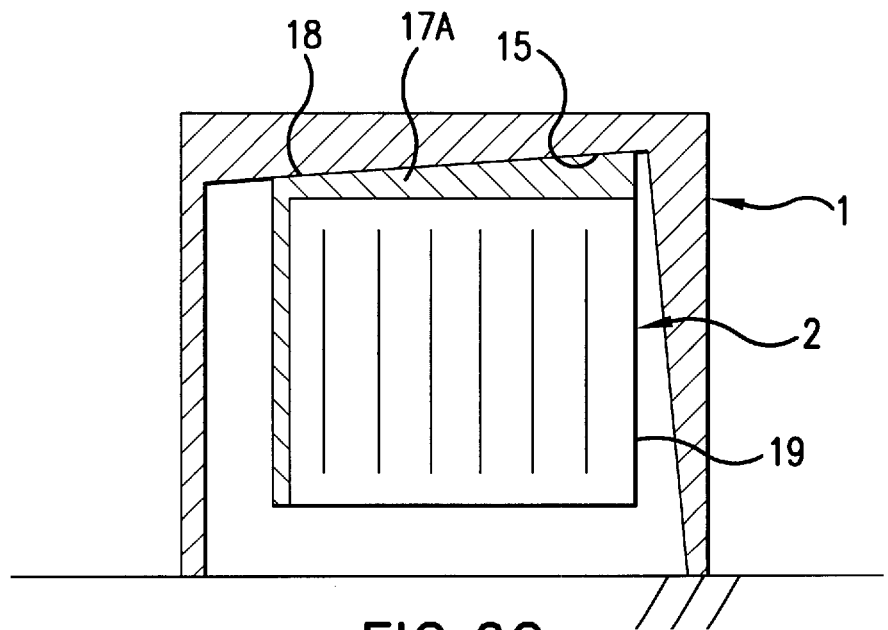

With reference to FIG. 6C, the carrier 2 is lift up so that the oblique outer and upper face 18 of the thickness-varied first flange 17 of the carrier 2 is made into contact with the oblique inner and bottom face 15 of the thickness-varied top wall of the bottom-free cubic-shaped cover 6 of the semiconductor wafer accommodating jig 1, whereby the semiconductor wafers in the carrier 2 is sealed with the bottom-free cubic-shaped cover 6 of the semiconductor wafer accommodating jig 1.

Figure 6D:
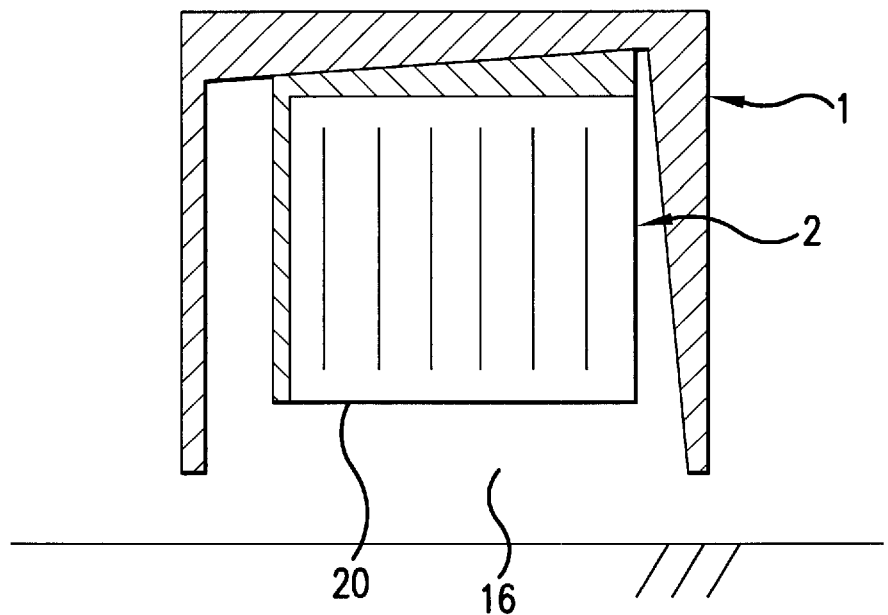

With reference to FIG. 6D, the carrier 2 is further lift up so that the bottom-free cubic-shaped cover 6 of the semiconductor wafer accommodating jig 1 is also lift up along with the carrier 2 with keeping the state that the semiconductor wafers 10 in the carrier 2 are sealed with the bottom-free cubic-shaped cover 6 of the semiconductor wafer accommodating jig 1. During the transfer of the carrier 2 between the first and second transfer tables 4 and 5, the opening side of the carrier 2 is made into contact securely with the oblique inner face 14 of the thickness-varied side wall of the bottom-free cubic-shaped cover 6 of the semiconductor wafer accommodating jig 1, whereby the semiconductor wafers 10 in the carrier 2 are isolated from the atmosphere.

FIGS. 7A through 7D are cross sectional elevation views illustrative of an operation of lifting the novel semiconductor wafer accommodating jig accommodating the carrier for subsequent transferring the semiconductor wafer accommodating jig together with the carrier directed so that the semiconductor wafers in the carrier are stacked in the vertical direction in the first embodiment in accordance with the present invention.

Figure 7A:
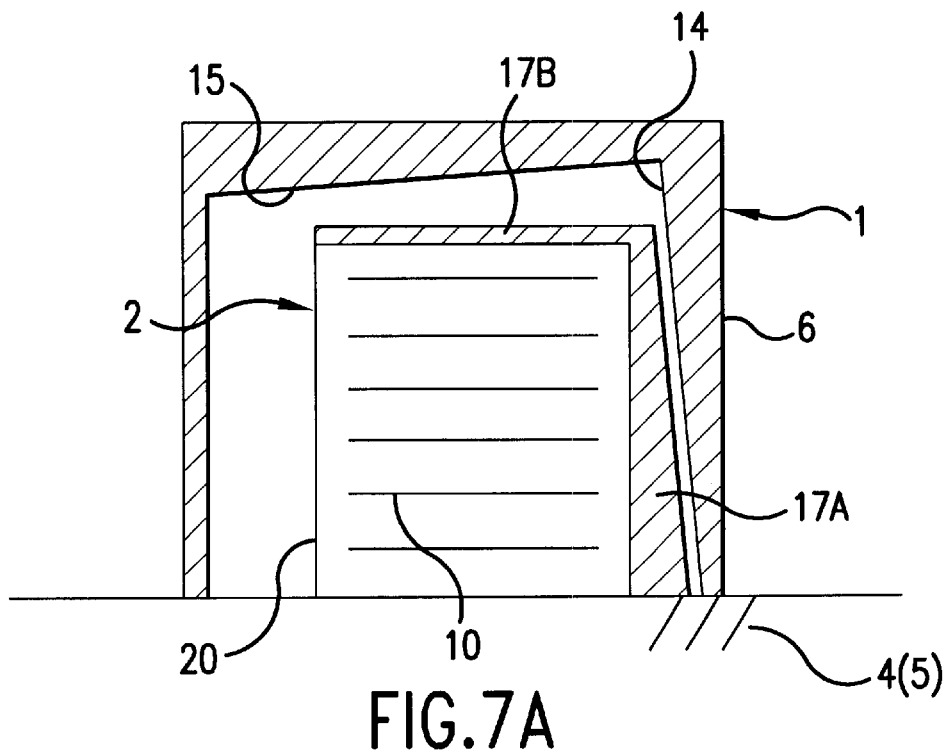
FIGS. 7A through 7D are cross sectional elevation views illustrative of an operation of lifting the novel semiconductor wafer accommodating jig accommodating the carrier for subsequent transferring the semiconductor wafer accommodating jig together with the carrier directed so that the semiconductor wafers in the carrier are stacked in the vertical direction in the first embodiment in accordance with the present invention.

With reference to FIG. 7A, the carrier 2 is accommodated in the bottom-free cubic-shaped cover 6 of the semiconductor wafer accommodating jig 1 so that the carrier 2 is directed so that the semiconductor wafers in the carrier 2 are stacked in the vertical direction, wherein the second flange 17B of the carrier 2 is positioned top, and the thickness of the first carrier flange 17A proportionally increases downwardly and the oblique outer face 18 of the first carrier flange 17A faces to the oblique inner face 14 of the thickness-varied side wall of the bottom-free cubic-shaped cover 6 of the semiconductor wafer accommodating jig 1. The thickness-uniform second flange 17B of the carrier 2 faces to the oblique inner and bottom face 15 of the thickness-varied top wall of the bottom-free cubic-shaped cover 6 of the semiconductor wafer accommodating jig 1, wherein the thickness of the top wall of the bottom-free cubic-shaped cover 6 of the semiconductor wafer accommodating jig 1 decreases toward the oblique inner face 14 of the thickness-varied side wall of the bottom-free cubic-shaped cover 6 of the semiconductor wafer accommodating jig 1, whereby the oblique outer face 18 of the thickness-varied first flange 17 of the carrier 2 is parallel to the oblique inner face 14 of the thickness-varied side wall of the bottom-free cubic-shaped cover 6 of the semiconductor wafer accommodating jig 1. The carrier 2 and the bottom-free cubic-shaped cover 6 of the semiconductor wafer accommodating jig 1 are placed on the flat surface of the first or second transfer table 4 or 5 so that the carrier 2 has no contact with the bottom-free cubic-shaped cover 6 of the semiconductor wafer accommodating jig 1.

Figure 7B:
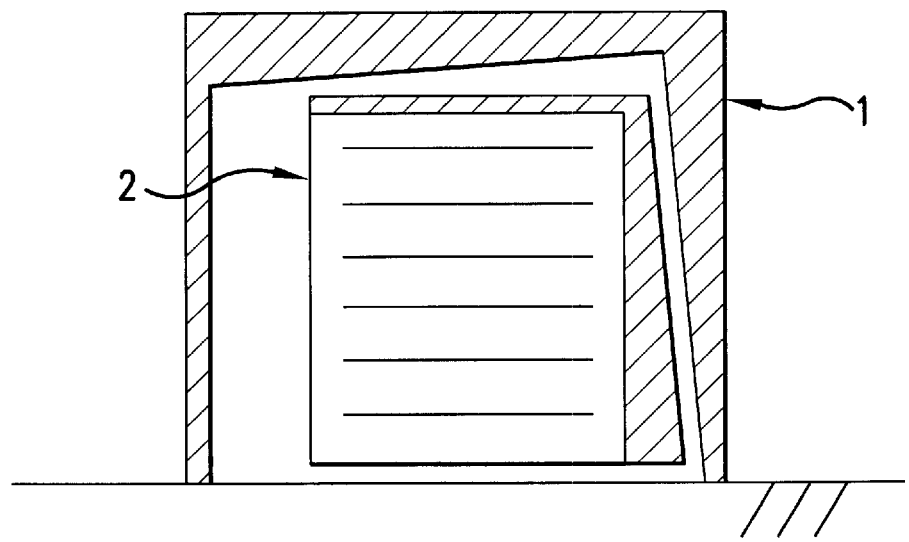

With reference to FIG. 7B, the L-shaped claws 13 are closed so that the distance between the inside edges of the L-shaped claws 13 comes smaller than the second dimension 1E and larger than the third dimension 2B, wherein the inside edges of the L-shaped claws 13 push the flexible sheets of the windows 8 into the openings and the inside edges of the L-shaped claws 13 enter into the openings, whereby the inside edges of the inwardly and laterally extending hook portions of the L-shaped claws 13 reach the bottoms of the second carrier flange 17B, resulting in that the L-shaped claws 13 are hooking the second flange 17B of the carrier 2 accommodated in the semiconductor wafer accommodating jig 1. The transfer device 3 is moved upwardly so that the L-shaped claws 13 hooking the second flange 17B of the carrier 2 lift up the carrier 2.

Figure 7C:
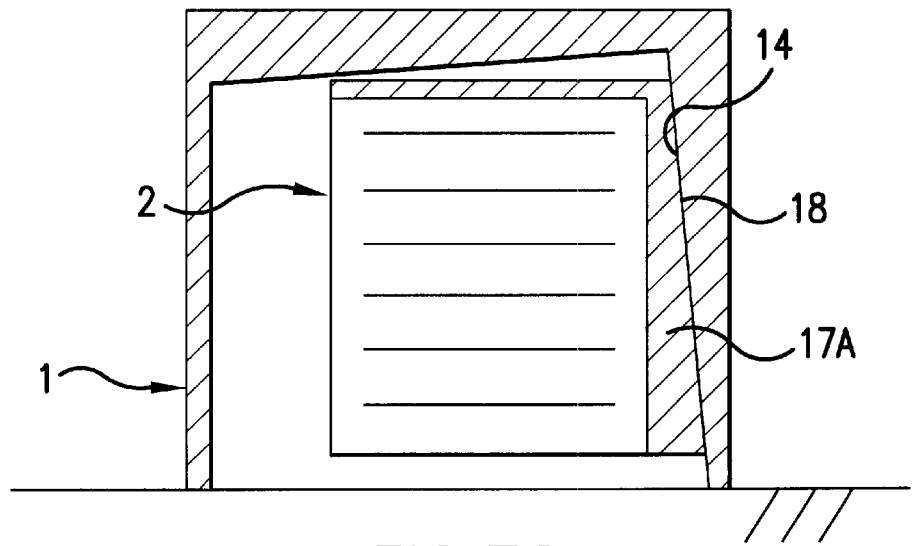

With reference to FIG. 7C, the carrier 2 is further lift up so that the oblique outer and upper face 18 of the thickness-varied first flange 17 of the carrier 2 is made into contact with the oblique inner face 14 of the thickness-varied side wall of the bottom-free cubic-shaped cover 6 of the semiconductor wafer accommodating jig 1, whereby the semiconductor wafers in the carrier 2 are sealed with the bottom-free cubic-shaped cover 6 of the semiconductor wafer accommodating jig 1.

Figure 7D:
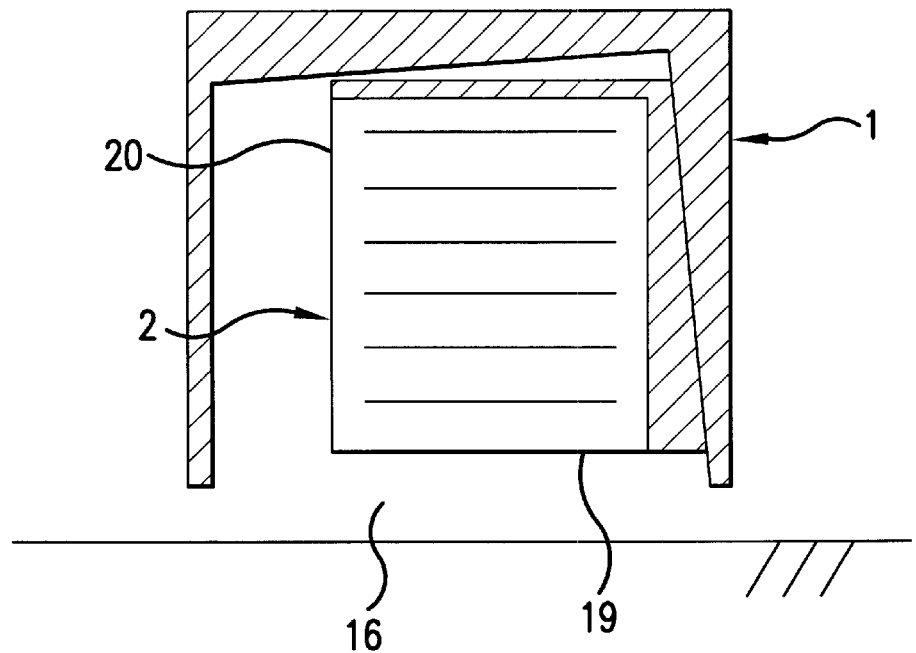

With reference to FIG. 7D, the carrier 2 is further lift up so that the bottom-free cubic-shaped cover 6 of the semiconductor wafer accommodating jig 1 is also lift up along with the carrier 2 with keeping the state that the semiconductor wafers in the carrier 2 is sealed with the bottom-free cubic-shaped cover 6 of the semiconductor wafer accommodating jig 1. During the transfer of the carrier 2 between the first and second transfer tables 4 and 5, the opening side of the carrier 2 is made into contact securely with the oblique inner face 14 of the thickness-varied side wall of the bottom-free cubic-shaped cover 6 of the semiconductor wafer accommodating jig 1, whereby the semiconductor wafers 10 in the carrier 2 are isolated from the atmosphere.

FIGS. 8A through 8L are cross sectional elevation views illustrative of sequential operations for transferring the carriers to be accommodated in the semiconductor wafer accommodating jig from the first transfer table to the second transfer table in the first embodiment in accordance with the present invention.

Figure 8A:
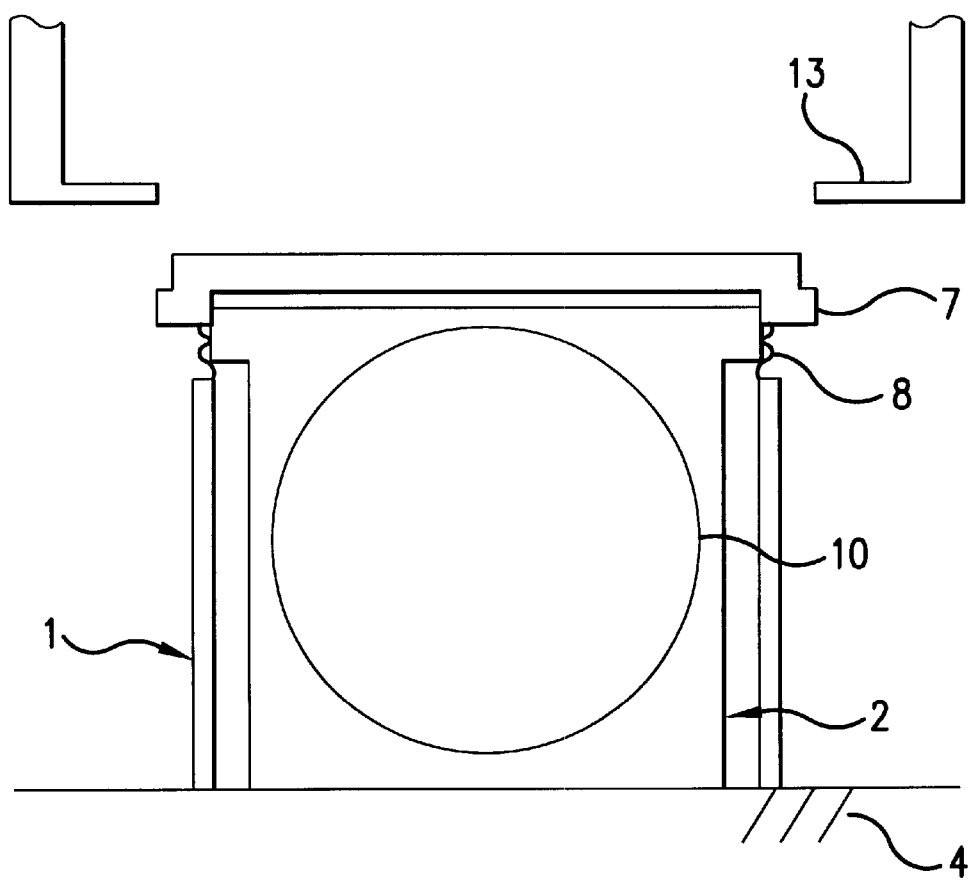

With reference to FIG. 8A, the carrier 2 is accommodated in the bottom-free cubic-shaped cover 6 of the semiconductor wafer accommodating jig 1 so that the carrier 2 is directed so that the semiconductor wafers in the carrier are aligned in the lateral direction, wherein the first flange 17A of the carrier is positioned top, and the thickness of the first carrier flange 17A proportionally increases toward the oblique inner face 14 of the thickness-varied side wall of the bottom-free cubic-shaped cover 6 of the semiconductor wafer accommodating jig 1. The oblique outer and upper face 18 of the thickness-varied first flange 17 of the carrier 2 faces to the oblique inner and bottom face 15 of the thickness-varied top wall of the bottom-free cubic-shaped cover 6 of the semiconductor wafer accommodating jig 1, wherein the thickness of the top wall of the bottom-free cubic-shaped cover 6 of the semiconductor wafer accommodating jig 1 decreases toward the oblique inner face 14 of the thickness-varied side wall of the bottom-free cubic-shaped cover 6 of the semiconductor wafer accommodating jig 1, whereby the oblique outer and upper face 18 of the thickness-varied first flange 17 of the carrier 2 is parallel to the oblique inner and bottom face 15 of the thickness-varied top wall of the bottom-free cubic-shaped cover 6 of the semiconductor wafer accommodating jig 1. The carrier 2 and the bottom-free cubic-shaped cover 6 of the semiconductor wafer accommodating jig 1 are placed on the flat surface of the first or second transfer table 4 or 5 so that the carrier 2 has no contact with the bottom-free cubic-shaped cover 6 of the semiconductor wafer accommodating jig 1.

Figure 8B:
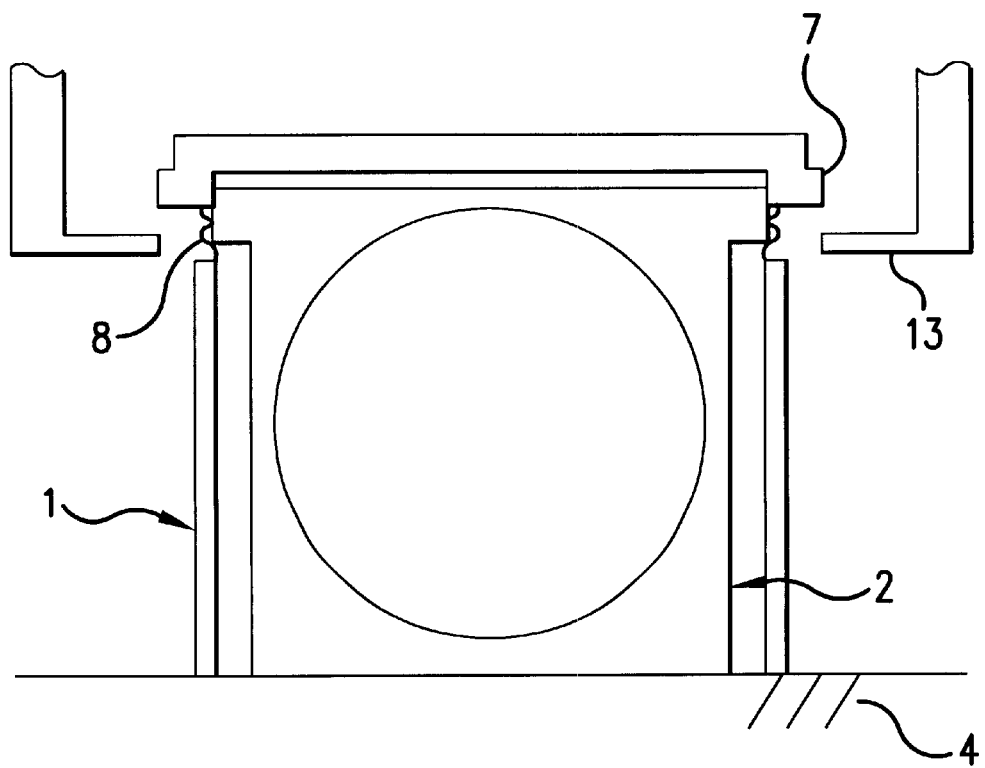

With reference to FIG. 8B, the L-shaped claws 13 are closed so that the distance between the inside edges of the L-shaped claws 13 comes smaller than the second dimension 1E and larger than the third dimension 2B, wherein the inside edges of the L-shaped claws 13 push the flexible sheets of the windows 8 into the openings and the inside edges of the L-shaped claws 13 enter into the openings, whereby the inside edges of the inwardly and laterally extending hook portions of the L-shaped claws 13 reach the bottoms of the carrier flanges 17A and also reach the outside faces of the side walls of the carrier 2, resulting in that the L-shaped claws 13 are hooking the first flange 17A of the carrier 2 accommodated in the semiconductor wafer accommodating jig 1. The transfer device 3 is moved upwardly so that the L-shaped claws 13 hooking the first flange 17A of the carrier 2 lift up the carrier 2.

Figure 8C:
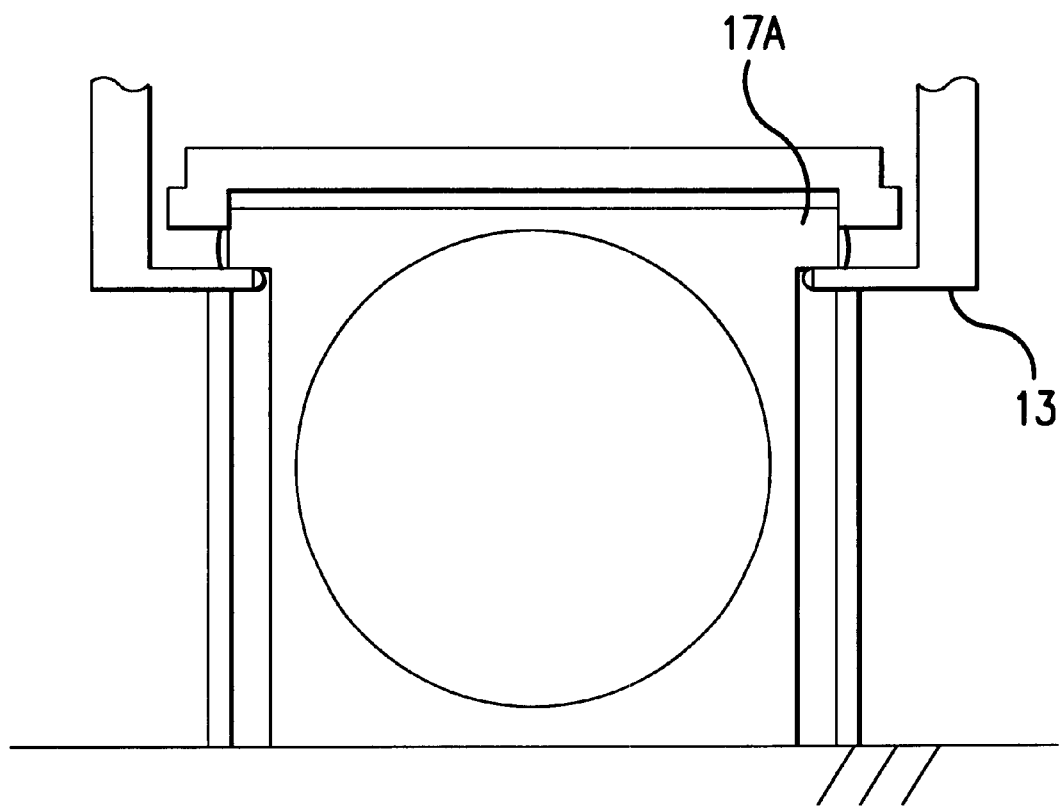

With reference to FIG. 8C, the carrier 2 is lift up so that the oblique outer and upper face 18 of the thickness-varied first flange 17 of the carrier 2 is made into contact with the oblique inner and bottom face 15 of the thickness-varied top wall of the bottom-free cubic-shaped cover 6 of the semiconductor wafer accommodating jig 1, whereby the semiconductor wafers in the carrier 2 is sealed with the bottom-free cubic-shaped cover 6 of the semiconductor wafer accommodating jig 1.

Figure 8D:
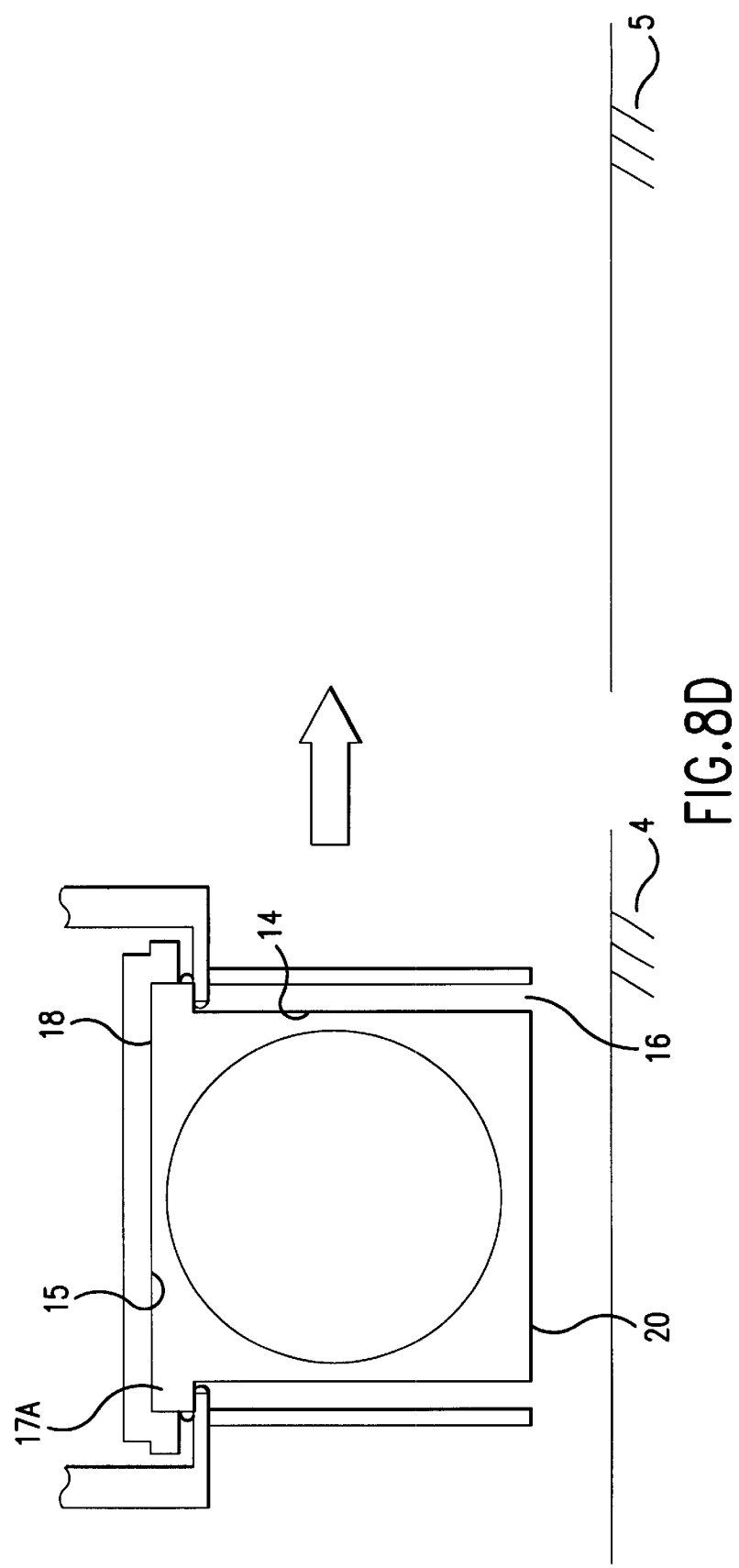

With reference to FIG. 8D, the carrier 2 is further lift up so that the bottom-free cubic-shaped cover 6 of the semiconductor wafer accommodating jig 1 is also lift up along with the carrier 2 with keeping the state that the semiconductor wafers 10 in the carrier 2 are sealed with the bottom-free cubic-shaped cover 6 of the semiconductor wafer accommodating jig 1. During the transfer of the carrier 2 between the first and second transfer tables 4 and 5, the opening side of the carrier 2 is made into contact securely with the oblique inner face 14 of the thickness-varied side wall of the bottom-free cubic-shaped cover 6 of the semiconductor wafer accommodating jig 1, whereby the semiconductor wafers 10 in the carrier 2 are isolated from the atmosphere.

With reference to FIGS. 8D and 8E, the transfer device 3 is moved from a position over the first transfer table 4 to a position over the second transfer table 5, so as to transfer the semiconductor wafer accommodating jig 1 accommodating the carrier 2 from the position over the first transfer table 4 to the position over the second transfer table 5 with keeping the sealing state that the oblique outer and upper face 18 of the thickness-varied first flange 17 of the carrier 2 remains contact with the oblique inner and bottom face 15 of the thickness-varied top wall of the bottom-free cubic-shaped cover 6 of the semiconductor wafer accommodating jig 1, whereby the semiconductor wafers in the carrier 2 remains sealed with the bottom-free cubic-shaped cover 6 of the semiconductor wafer accommodating jig 1.

Figure 8F:
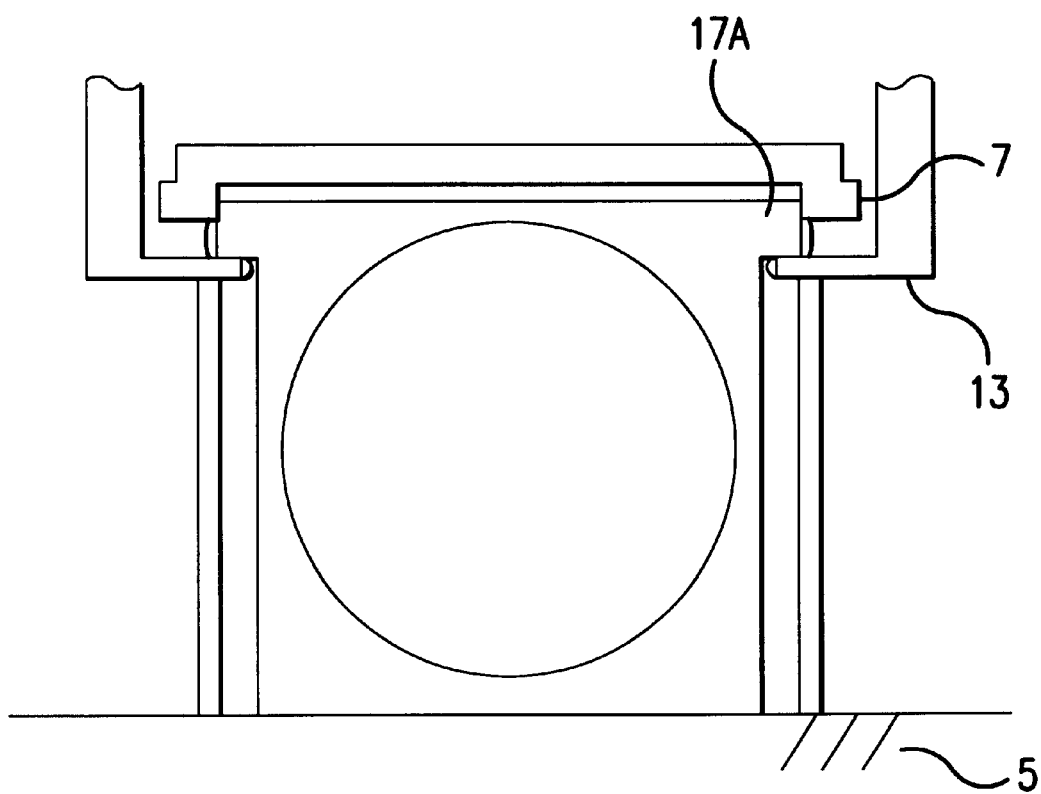

With reference to FIG. 8F, the transfer device 3 is moved downwardly so that the semiconductor wafer accommodating jig 1 accommodating the carrier 2 with the first carrier flange 17A hooked by the claws 13 of the transfer device 3 falls down onto a flat surface of the second transfer table 5, whereby the semiconductor wafer accommodating jig 1 and the carrier 2 are placed on the flat surface of the second transfer table 5, resulting in that the oblique outer and upper face 18 of the thickness-varied first flange 17 of the carrier 2 is detached from the oblique inner and bottom face 15 of the thickness-varied top wall of the bottom-free cubic-shaped cover 6 of the semiconductor wafer accommodating jig 1.

Figure 8G:
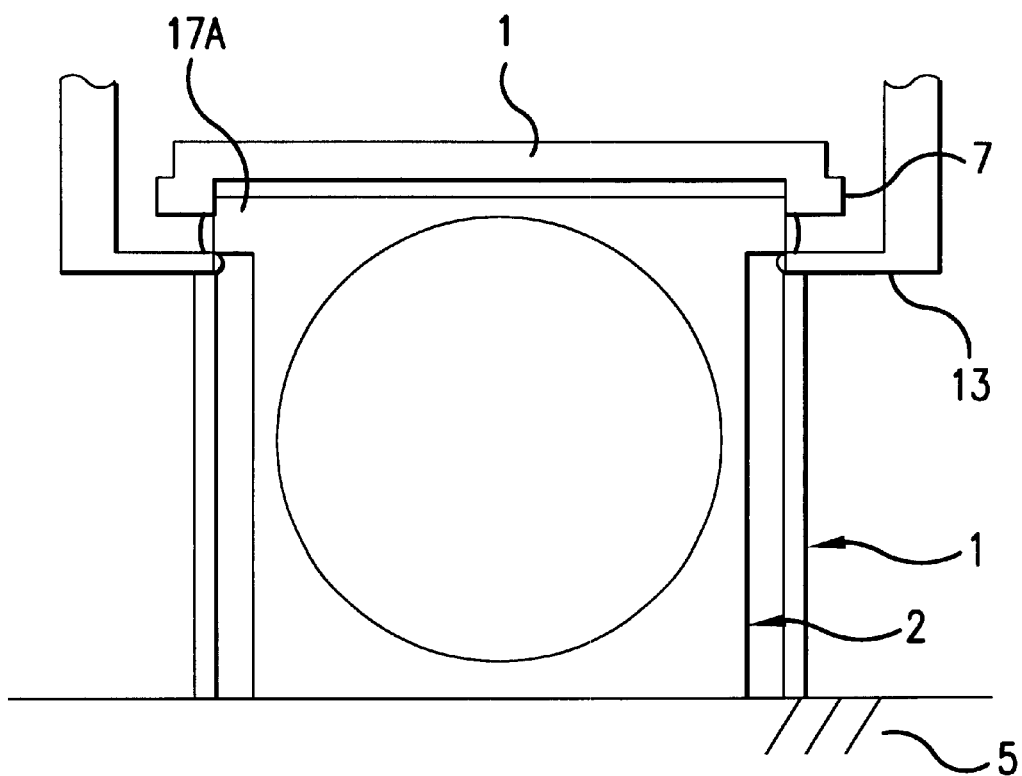

With reference to FIG. 8G, the claws 13 of the transfer device 3 are opened so that the distance between the inside edges of the L-shaped claws 13 is smaller than the first dimension 1D defined to be a distance between opposite edges of the jig flange 7 and larger than the second dimension 1E defined to be a distance between opposite inner walls of the semiconductor wafer accommodating jig 1.

Figure 8H:
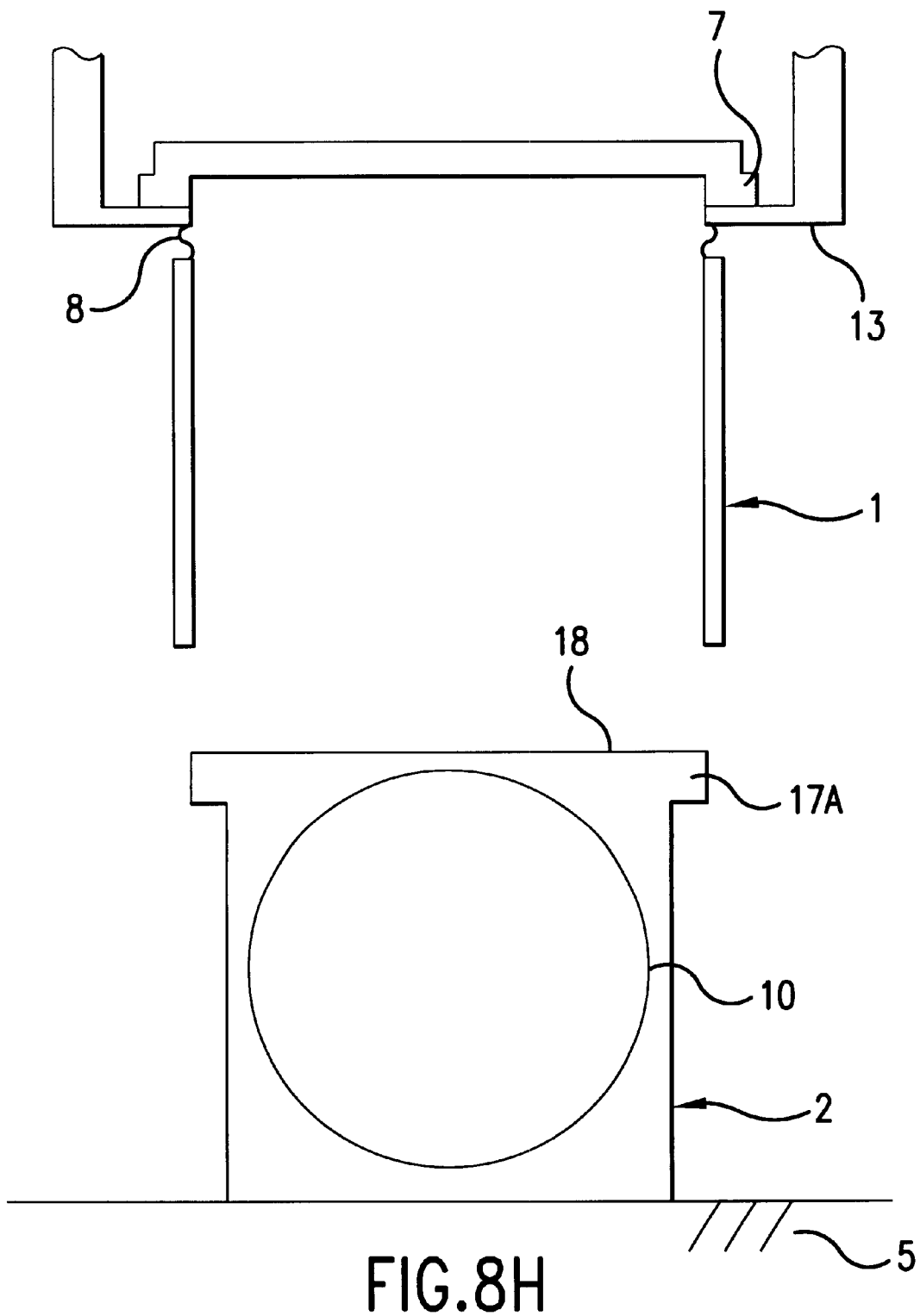
Figure 81:
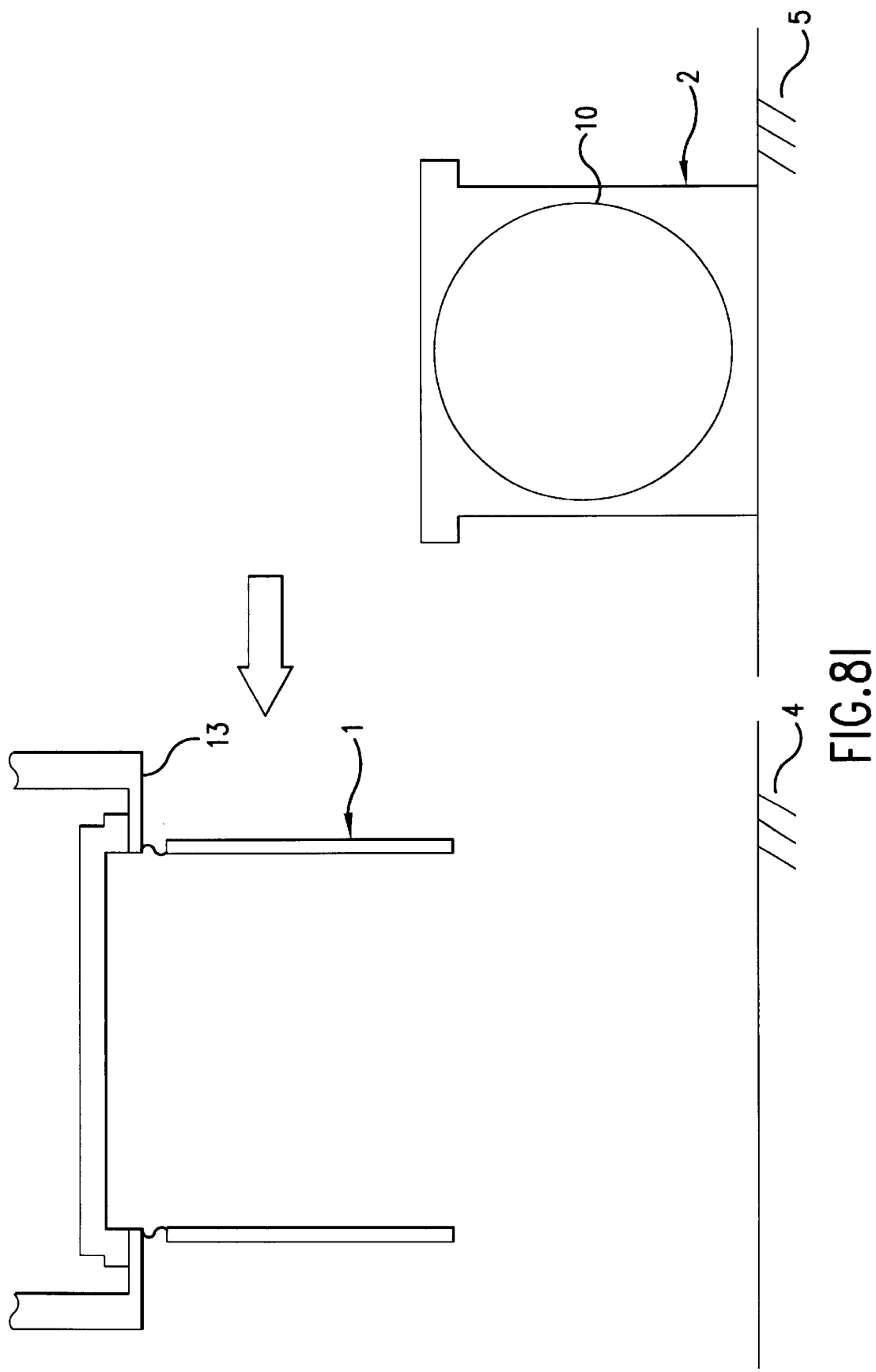

With reference to FIG. 8H, the transfer device 3 is moved upwardly so that then the L-shaped claws 13 are hooking the flange 7 of the semiconductor wafer accommodating jig 1 and then the transfer device 3 is further moved upwardly so as to lift up only the semiconductor wafer accommodating jig 1 from the flat surface of the second transfer table 5, whilst the carrier 2 remains on the flat surface of the second transfer table 5.

With reference to FIG. 8J, the transfer device 3 is moved from the position over the second transfer table 5 to the position over the first transfer table 4 so as to transfer only the semiconductor wafer accommodating jig 1 from the position over the second transfer table 5 to the position over the first transfer table 4.

With reference to FIG. 8K, the transfer device 3 is moved downwardly so that the semiconductor wafer accommodating jig 1 is fallen down onto the flat surface of the second transfer table 5, whereby the semiconductor wafer accommodating jig 1 is placed on the flat surface of the second transfer table 5.

With reference to FIG. 8K, the claws 13 of the transfer device 3 are further opened so that the distance between the inside edges of the L-shaped claws 13 is larger than the first dimension 1D defined to be a distance between opposite edges of the jig flange 7, thereby releasing the semiconductor wafer accommodating jig 1 from the transfer device 3.

Figure 8L:
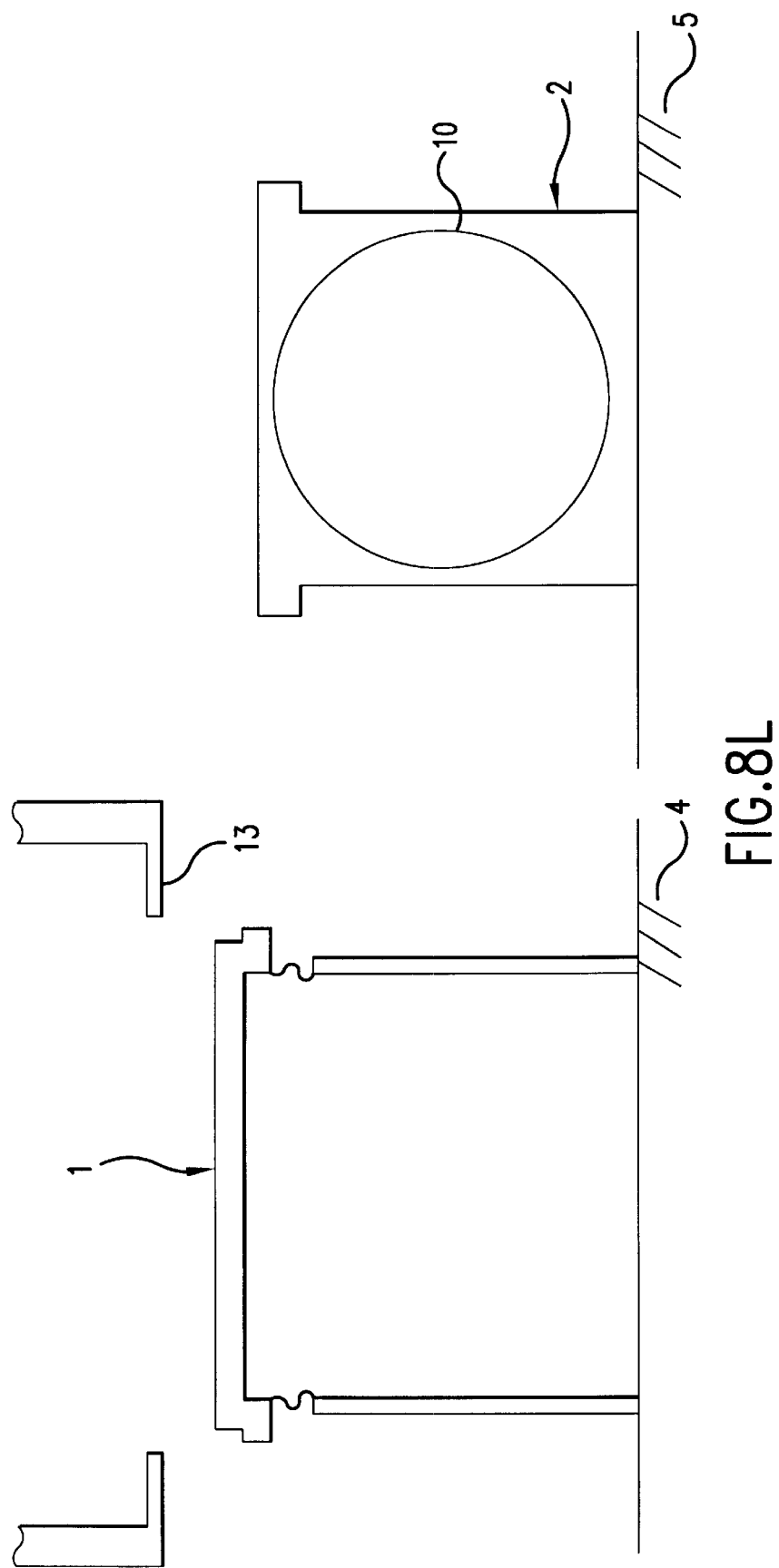

With reference to FIG. 8L, the transfer device 3 with the claws 13 is moved upwardly whilst the semiconductor wafer accommodating jig 1 remains on the flat surface of the first transfer table 4.

The above descriptions have been directed to the unloading operation. Notwithstanding, the loading operation is the reverse processes of FIGS. 8L through 8A to the above unloading operation.

Figure 9:
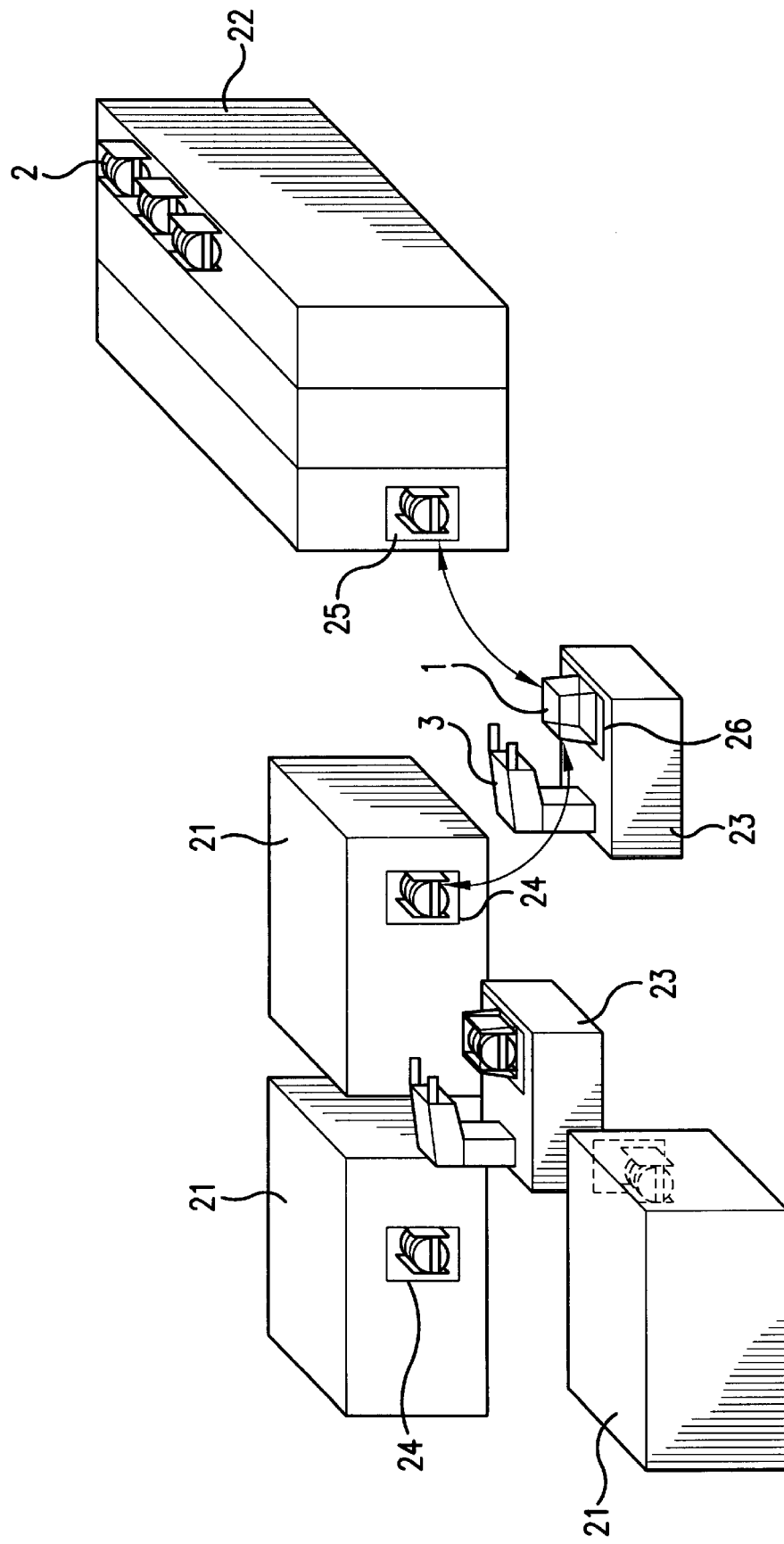
FIG. 9 is a schematic perspective view illustrative of a novel production line utilizing the above novel carrier transfer system in the first embodiment in accordance with the present invention.

FIG. 9 is a schematic perspective view illustrative of a novel production line utilizing the above novel carrier transfer system in the first embodiment in accordance with the present invention. The novel production line has a plurality of manufacturing equipments 21, a plurality of automatic carrier trucks 23, and an automatic rack 22. Each of the automatic carrier trucks 23 has a loading surface 26 for carrying the semiconductor wafer accommodating jig 1 accommodating the carrier 2 for carrying a plurality of the semiconductor wafers 10. Each of the manufacturing equipments 21 has an entrance 24 without any additional transfer system. The automatic rack 22 also has an entrance 25 without any additional transfer system. Each of the automatic carrier trucks 23 has the transfer device 3. The operation of transferring the carrier from the automatic rack 22 to the manufacturing equipment 21 is accomplished as follows. The carrier 2 with the semiconductor wafers 10 appears on the entrance 25 of the automatic rack 22. Any of the automatic carrier trucks 23 is allocated and then moved to the entrance 25 of the automatic rack 22. The transfer device 3 provided on the automatic carrier truck 23 is operated to move the semiconductor wafer accommodating jig 1 from the loading surface 26 to the entrance 25 of the automatic rack 22 so that there are carried out the loading operations which are the reverse processes to the unloading operations described above with reference to FIGS. 8A through 8L, whereby the carrier 2 is accommodated within the semiconductor wafer accommodating jig 1 and transferred from the entrance 25 of the automatic rack 22 onto the loading surface 26 of the automatic carrier truck 23. The automatic carrier truck 23 carries to selected one of the manufacturing equipments 21, so that the transfer device 3 provided on the automatic carrier truck 23 is operated to move the semiconductor wafer accommodating jig 1 with the carrier 2 from the loading surface 26 to the entrance 25 of the manufacturing equipments 21.

Figure 10:
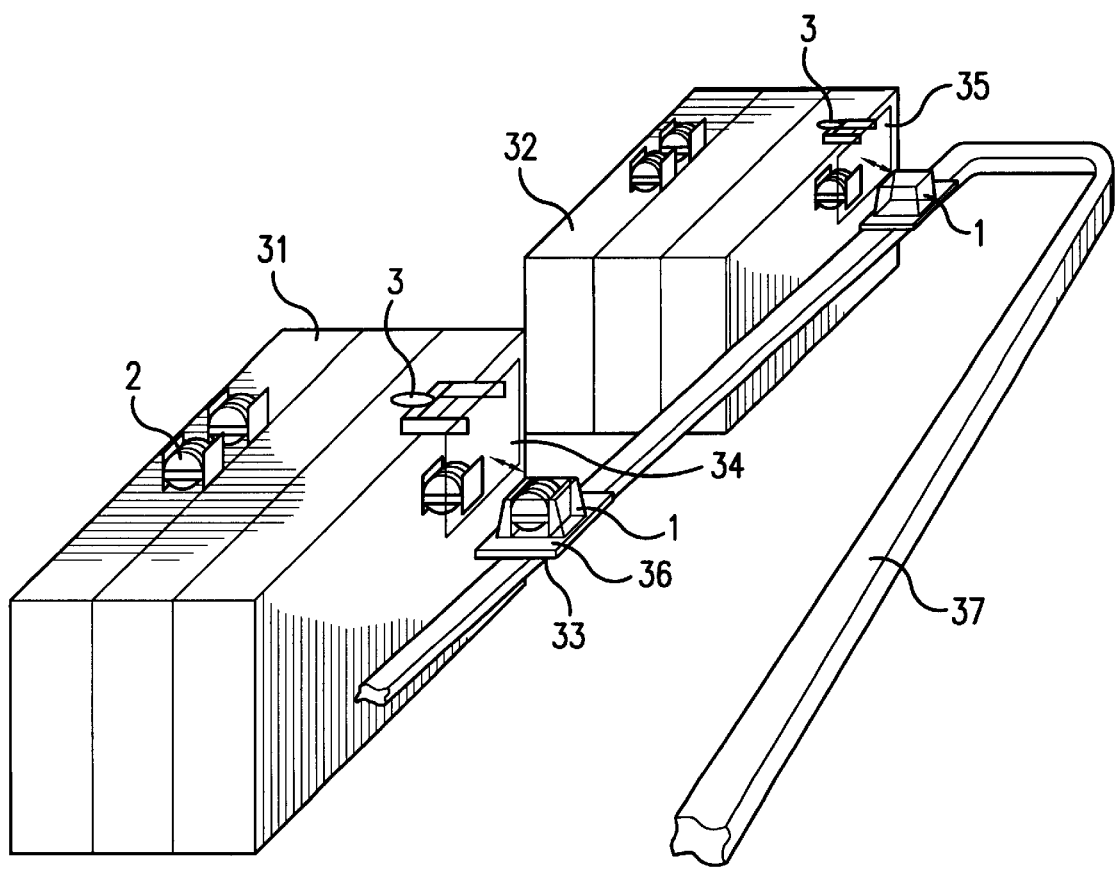
FIG. 10 is a schematic perspective view illustrative of a novel modified production line utilizing the above novel carrier transfer system in the modification to the above first embodiment in accordance with the present invention.

FIG. 10 is a schematic perspective view illustrative of a novel modified production line utilizing the above novel carrier transfer system in the modification to the above first embodiment in accordance with the present invention. The novel production line has a plurality of vehicles 33 with loading surfaces 36, which are automatically travel on a rail 37, and first and second automatic racks 31 and 32. The first automatic rack 31 has a first entrance 34 and a first transfer device 3. The second automatic rack 32 has a second entrance 35 and a second transfer device 3'. The operation of transferring the carrier from the first automatic rack 31 to the second automatic rack 32 is accomplished as follows. The carrier 2 with the semiconductor wafers 10 appears on the entrance 35 of the second automatic rack 32. Any of the vehicle 33 is allocated and then moved to the entrance 35 of the second automatic rack 32. The second transfer device 3' provided on the second automatic rack 32 is operated to move the semiconductor wafer accommodating jig 1 from the loading surface 36 to the entrance 35 of the second automatic rack 32 so that there are carried out the loading operations which are the reverse processes to the unloading operations described above with reference to FIGS. 8A through 8L, whereby the carrier 2 is accommodated within the semiconductor wafer accommodating jig 1 and transferred from the entrance 35 of the second automatic rack 32 onto the loading surface 36 of the vehicle 33. The vehicle 33 carries the semiconductor wafer accommodating jig 1 with the carrier 2 to the entrance 34 of the first automatic rack 31, so that the first transfer device 3 provided on the first automatic rack 31 is operated to move the semiconductor wafer accommodating jig 1 with the carrier 2 from the loading surface 36 to the entrance 34 of the first automatic rack 31.

The above novel carrier transfer system has the following four advantages. The first advantage of the novel carrier transfer system is that it takes a short time to carry the carrier and loading or unloading the carrier because it is possible concurrent operations of opening and closing the carrier cover and of transferring the carrier.

The second advantage is that no additional space is necessary because there need no installation of the opening and closing transfer system having the carrier transfer device separately from the box transfer device.

The third disadvantage is that it is unnecessary to provide the opening and closing transfer systems for every manufacturing equipments, for which reason the production systems is not expensive, resulting in the reduced manufacturing cost. Further, a reduced cost is necessary to improve the production system.

The fourth advantage is that even if a gas is generated from the semiconductor wafers so that the sealed box is filled with the gas, then the gas may provide no influences to the characteristic of the semiconductor wafers due to a short time exposure of the semiconductor wafers to the generated gas.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A transfer system comprising:

a transfer device having at least a pair of claws adjustable in a distance between inside edges of said claws;

a carrier for carrying at least an article, said carrier comprising a first container having a first opening larger than said article, and said carrier having at least a first flange structure which extends from a peripheral portion of said first opening, and said first flange structure having a first size defined to be a distance between opposite edges of said first flange structure in a first direction; and a jig comprising a second container having a second opening with a second size larger than said first size of said first flange structure of said carrier, and said jig further having at least a second flange structure in an opposite side to a side provided with said second flange structure, and said second opening having a third size larger than said second size, and said jig also having at least a window structure which extends at least opposite sides and which is positioned adjacent to said second flange structure, so that said window structure is closer to said second opening than said second flange structure, wherein said first opening of said carrier is sealable with a part of an inner wall of said second container as said jig by making said first opening of said carrier into contact with said part of said inner wall of said second container as said jig, and wherein said window structure comprises flexible sheets deformable by pushing said claws to said flexible sheets.

2. The transfer system as claimed in claim 1, wherein said first container as said carrier has a rectangular parallelepiped shape comprising a bottom wall and four side walls, and said first flange comprises at least a pair of first flanges extending outwardly from a first pair of opposite sides of peripherals of said first opening, and wherein said second container as said jig also has a rectangular parallelepiped shape comprising a top wall and four side walls, and said second flange structure comprises at least a pair of second flanges extending outwardly from a first pair of opposite sides of said top wall, and said window structure comprises at least a pair of said flexible sheets provided in a first pair of opposite side walls of said four side walls so that said flexible sheets are positioned directly under said second flanges of said jig.

3. The transfer system as claimed in claim 2, wherein said top wall of said jig has an inner face downwardly and said inner face has an oblique angle to a flat level, and outer faces of said first flanges have the same oblique angle so that said outer faces of said first flanges of said carrier are parallel to said inner face of said top wall of said jig.

4. The transfer system as claimed in claim 3, wherein said top wall of said jig has an outer face upwardly and said outer face is parallel to said flat level, so that said top wall varies in thickness in a lateral direction.

5. The transfer system as claimed in claim 2, wherein at least one of second paired opposite side walls of said four side walls of said jig has an inner face with an oblique angle to a vertical plane, and outer faces of said first flanges have the same oblique angle so that said outer faces of said first flanges of said carrier are parallel to said inner face of said top wall of said jig.

6. The transfer system as claimed in claim 5, wherein said at least one of second paired opposite side walls of said jig has an outer face parallel to said vertical plane, so that said at least one of second paired opposite side walls varies in thickness in a vertical direction.

7. A semiconductor wafer production system including a transfer system comprising:

a transfer device having at least a pair of claws adjustable in a distance between inside edges of said claws;

a carrier for carrying at least an article, said carrier comprising a first container having a first opening larger than said article, and said carrier having at least a first flange structure which extends from a peripheral portion of said first opening, and said first flange structure having a first size defined to be a distance between opposite edges of said first flange structure in a first direction; and a jig comprising a second container having a second opening with a second size larger than said first size of said first flange structure of said carrier, and said jig further having at least a second flange structure in an opposite side to a side provided with said second flange structure, and said second opening having a third size larger than said second size, and said jig also having at least a window structure which extends at least opposite sides and which is positioned adjacent to said second flange structure, so that said window structure is closer to said second opening than said second flange structure, wherein said first opening of said carrier is sealable with a part of an inner wall of said second container as said jig by making said first opening of said carrier into contact with said part of said inner wall of said second container as said jig, and wherein said window structure comprises flexible sheets deformable by pushing said claws to said flexible sheets.

8. The semiconductor wafer production system as claimed in claim 7, wherein said first container as said carrier has a rectangular parallelepiped shape comprising a bottom wall and four side walls, and said first flange comprises at least a pair of first flanges extending outwardly from a first pair of opposite sides of peripherals of said first opening, and wherein said second container as said jig also has a rectangular parallelepiped shape comprising a top wall and four side walls, and said second flange structure comprises at least a pair of second flanges extending outwardly from a first pair of opposite sides of said top wall, and said window structure comprises at least a pair of said flexible sheets provided in a first pair of opposite side walls of said four side walls so that said flexible sheets are positioned directly under said second flanges of said jig.

9. The semiconductor wafer production system as claimed in claim 8, wherein said top wall of said jig has an inner face downwardly and said inner face has an oblique angle to a flat level, and outer faces of said first flanges have the same oblique angle so that said outer faces of said first flanges of said carrier are parallel to said inner face of said top wall of said jig.

10. The semiconductor wafer production system as claimed in claim 9, wherein said top wall of said jig has an outer face upwardly and said outer face is parallel to said flat level, so that said top wall varies in thickness in a lateral direction.

11. The semiconductor wafer production system as claimed in claim 8, wherein at least one of second paired opposite side walls of said four side walls of said jig has an inner face with an oblique angle to a vertical plane, and outer faces of said first flanges have the same oblique angle so that said outer faces of said first flanges of said carrier are parallel to said inner face of said top wall of said jig.

12. The semiconductor wafer production system as claimed in claim 11, wherein said at least one of second paired opposite side walls of said jig has an outer face parallel to said vertical plane, so that said at least one of second paired opposite side walls varies in thickness in a vertical direction.

\* \* \* \* \*